US012653072B2

(12) United States Patent
Lee et al.

(10) Patent No.: US 12,653,072 B2
(45) Date of Patent: Jun. 9, 2026

(54) SEMICONDUCTOR DEVICE AND METHOD OF MANUFACTURING THE SAME

(71) Applicant: SAMSUNG ELECTRONICS CO., LTD., Suwon-si (KR)

(72) Inventors: Hyuekjae Lee, Suwon-si (KR); Minki Kim, Suwon-si (KR); Seungduk Baek, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 296 days.

(21) Appl. No.: 18/221,465

(22) Filed: Jul. 13, 2023

(65) Prior Publication Data

US 2024/0072003 A1     Feb. 29, 2024

(30) Foreign Application Priority Data

Aug. 31, 2022     (KR) ........................ 10-2022-0110161

(51) Int. Cl.
*H10W 90/00*     (2026.01)
*H10W 72/90*     (2026.01)
*H10W 74/00*     (2026.01)
*H10W 80/00*     (2026.01)
*H10W 90/20*     (2026.01)

(52) U.S. Cl.
CPC .......... *H10W 90/00* (2026.01); *H10W 72/926* (2026.01); *H10W 74/00* (2026.01); *H10W 80/721* (2026.01); *H10W 90/297* (2026.01); *H10W 90/792* (2026.01); *H10W 90/794* (2026.01)

(58) Field of Classification Search
None
See application file for complete search history.

(56) References Cited

U.S. PATENT DOCUMENTS

| | | | |
|---|---|---|---|
| 9,437,572 B2 | 9/2016 | Chen et al. | |
| 9,736,941 B1 | 8/2017 | Kunimoto | |
| 10,854,574 B2 | 12/2020 | Chen et al. | |
| 10,964,664 B2 * | 3/2021 | Mandalapu | ............ H01L 24/33 |
| 11,257,791 B2 | 2/2022 | Chen et al. | |
| 11,279,615 B2 | 3/2022 | Lin et al. | |
| 2008/0142990 A1 * | 6/2008 | Yu | ........................ H10D 84/038 438/109 |
| 2019/0115277 A1 | 4/2019 | Yu et al. | |
| 2020/0105720 A1 | 4/2020 | Yuan et al. | |
| 2020/0135699 A1 | 4/2020 | Hwang et al. | |

FOREIGN PATENT DOCUMENTS

| | | |
|---|---|---|
| KR | 2002-0010937 A | 2/2002 |
| KR | 2016-0066120 A | 6/2016 |
| TW | 202205600 A | 2/2022 |

* cited by examiner

*Primary Examiner* — Hung K Vu
(74) *Attorney, Agent, or Firm* — Fish & Richardson P.C.

(57) ABSTRACT

A semiconductor device includes a first chip and a second chip stacked on the first chip. The first chip includes a first substrate, a first upper pad on an upper surface of the first substrate, a first upper insulating layer surrounding a lower portion of the first upper pad and a sacrificial layer surrounding an upper portion of the first upper pad. The second chip includes a second substrate, a second upper pad on an upper surface of the second substrate and a second upper insulating layer surrounding the second upper pad, wherein a thickness of the second upper pad is less than a thickness of the first upper pad.

19 Claims, 21 Drawing Sheets

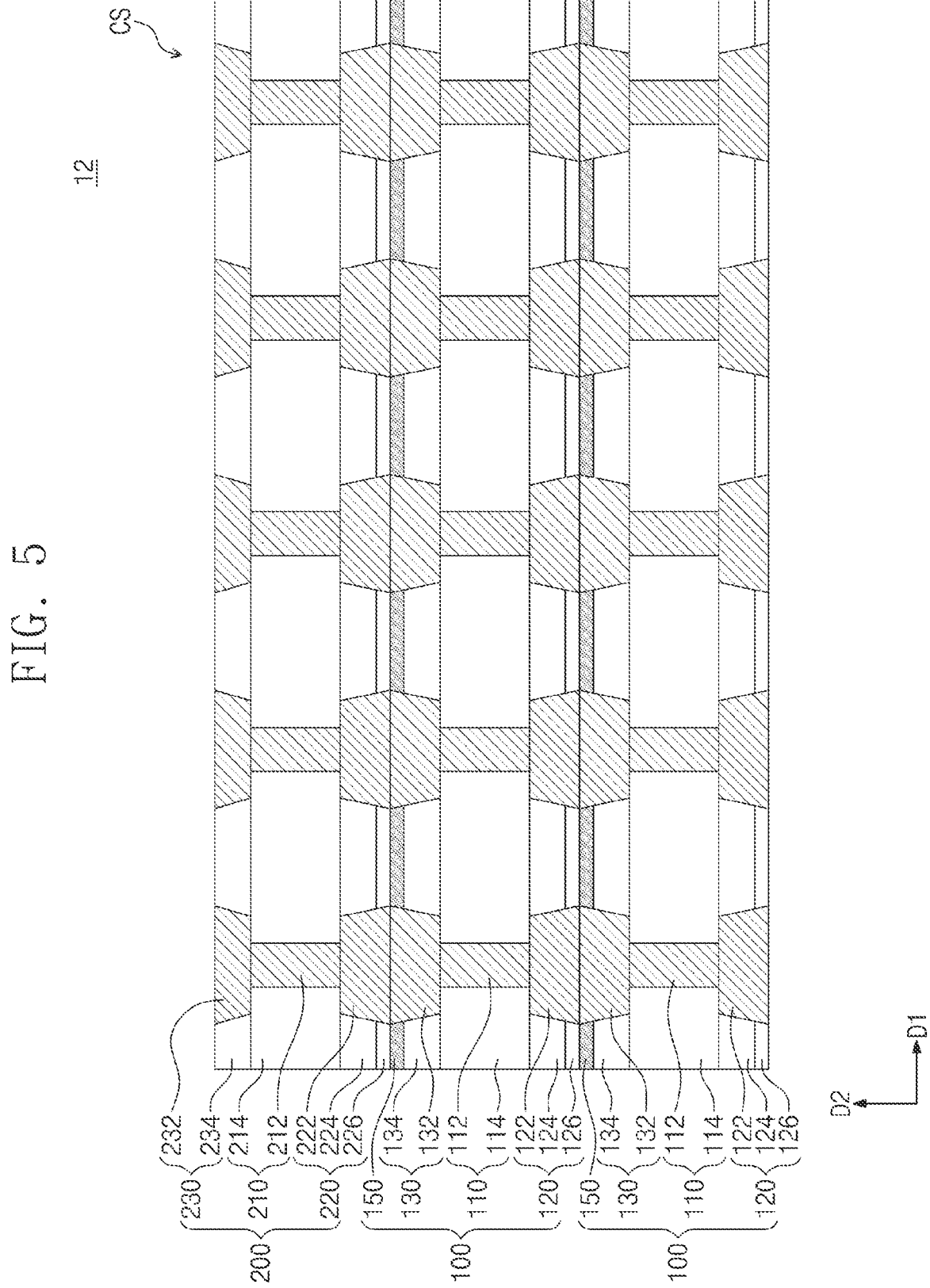

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2022-0110161 filed on Aug. 31, 2022 in the Korean Intellectual Property Office, the subject matter of which is hereby incorporated by reference in its entirety.

BACKGROUND

The inventive concept relates generally to semiconductor devices, and more particularly to directly bonded semiconductor devices. The inventive concept also relates to methods of manufacturing such semiconductor devices.

As high-capacity, thin and small semiconductor devices, as well as electronic products including same, have been much in demand, various packaging techniques associated with the fabrication of semiconductor devices have become subjects for continuing development. In certain packaging techniques, a number of semiconductor chips are vertically "stacked" one on top of the other(s) to realize high density stacked structure. In this regard different types of semiconductor chips (e.g., semiconductor chips performing different functions) may be commonly integrated into a general package occupying a footprint on a substrate (e.g., a printed circuit board or PCB) that is about the same size as a single semiconductor chip. Using such packaging techniques, various integrated circuit chips may be realized in the form of a semiconductor package that may be appropriately applied to various electronic product(s).

In a typical semiconductor package, one or more semiconductor chip(s) may be mechanically mounted and/or electrically connected to a PCB through the use of (e.g.,) bonding wires and/or conductive bumps. Further in this regard, various fabrication techniques intended to improve electrical performance and boost productivity in the manufacture of semiconductor packages have been closely studied.

SUMMARY

Embodiments of the inventive concept provide semiconductor devices exhibiting improved electrical performance and better driving stability. Other embodiments of the inventive concept may provide methods of manufacturing such semiconductor devices.

In one aspect, a semiconductor device may include a first chip structure and a second chip structure sequentially stacked the first chip structure, wherein each of the first chip structure and the second chip structure includes a first chip and a second chip stacked on the first chip. The first chip may include a first substrate, a first upper bonding layer on an upper surface of the first substrate, and including a first upper pad and a first upper insulating layer surrounding at least a portion of the first upper pad, a sacrificial layer on the first upper insulating layer and surrounding at leas tan upper portion of the first upper pad, and a first lower bonding layer on a lower surface of the first substrate, and including a first lower pad and a first lower insulating layer surrounding at least a portion of the first lower pad. The second chip may include a second substrate, a second upper bonding layer on an upper surface of the second substrate, including a second upper pad, and surrounding at least a portion of the second upper pad and a second lower bonding layer on a lower surface of the second substrate, including a second lower pad and a second lower insulating layer surrounding at least a portion of the second lower pad, wherein the sacrificial layer is disposed between the first upper insulating layer of the first chip and the second lower bonding layer of the second chip, and the first lower bonding layer of the first chip of the second chip structure directly contacts the second upper bonding layer of the second chip of the first chip structure.

In another aspect, a semiconductor device may include a first chip and a second chip stacked on the first chip. The first chip may include a first substrate, a first upper pad on an upper surface of the first substrate, a first upper insulating layer surrounding a lower portion of the first upper pad, and a sacrificial layer surrounding an upper portion of the first upper pad. The second chip may include a second substrate, a second upper pad on an upper surface of the second substrate, and a second upper insulating layer surrounding the second upper pad, wherein a thickness of the second upper pad is less than a thickness of the first upper pad.

In another aspect, a method of manufacturing a semiconductor device may include; mounting at least one first chip on an assembly substrate, wherein a first upper insulating layer and a first sacrificial layer are sequentially formed on an upper surface of the at least one first chip, stacking at least one preliminary second chip on the at least one first chip, wherein a second upper insulating layer and a second sacrificial layer are sequentially formed on an upper surface of the at least one preliminary second chip and applying a polishing process to the at least one preliminary second chip to remove at least a portion of the second sacrificial layer and to form at least one second chip, wherein the second sacrificial layer has a polishing selectivity with respect to the second upper insulating layer.

In another aspect, a semiconductor device may include; a first chip stack and a second chip stack spaced apart on a package substrate, wherein each of the first chip stack and the second chip stack includes at least one first chip including a sacrificial layer on an upper surface of the first chip and a second chip stacked on the at least one first chip, and a first stacking arrangement order for the first chip stack is the same as a second stacking arrangement order for the second chip stack.

BRIEF DESCRIPTION OF THE DRAWINGS

Advantages, benefits and features, as well as the making and use of the inventive concept will become more apparent to those skilled in the art upon consideration of the following detailed description and accompanying drawing, in which:

FIG. 1 is a cross-sectional view illustrating a semiconductor device 10 according to embodiments of the inventive concept;

FIG. 3 is a cross-sectional view illustrating a semiconductor device 11 according to embodiments of the inventive concept;

FIGS. 5, 6, 7, 8A, 8B, 9 and 10 are respective cross-sectional views variously illustrating semiconductor devices 12, 13, 14, 15, 16, 17 and 18 according to embodiments of the inventive concept;

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
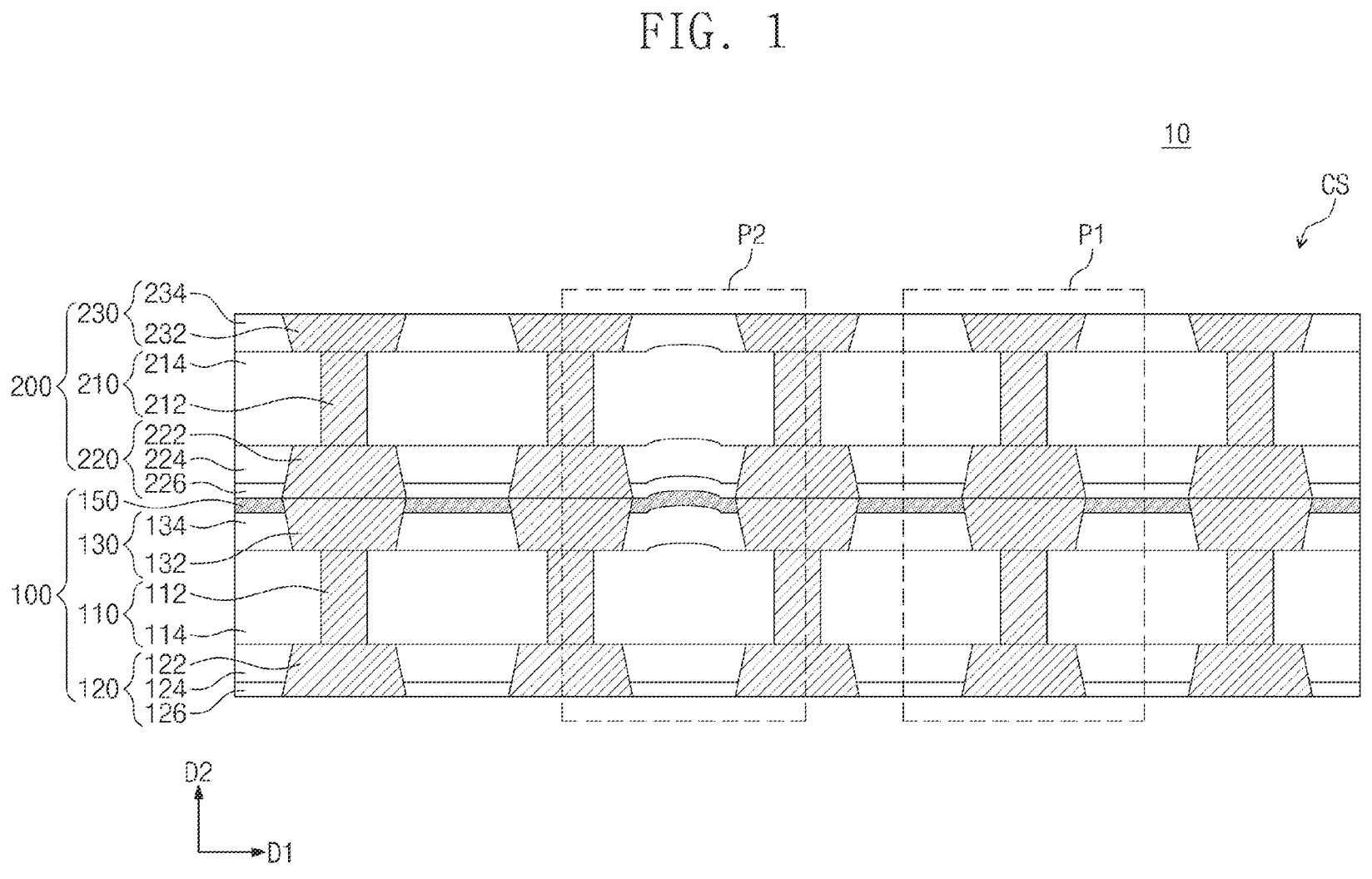
Figure 2A:
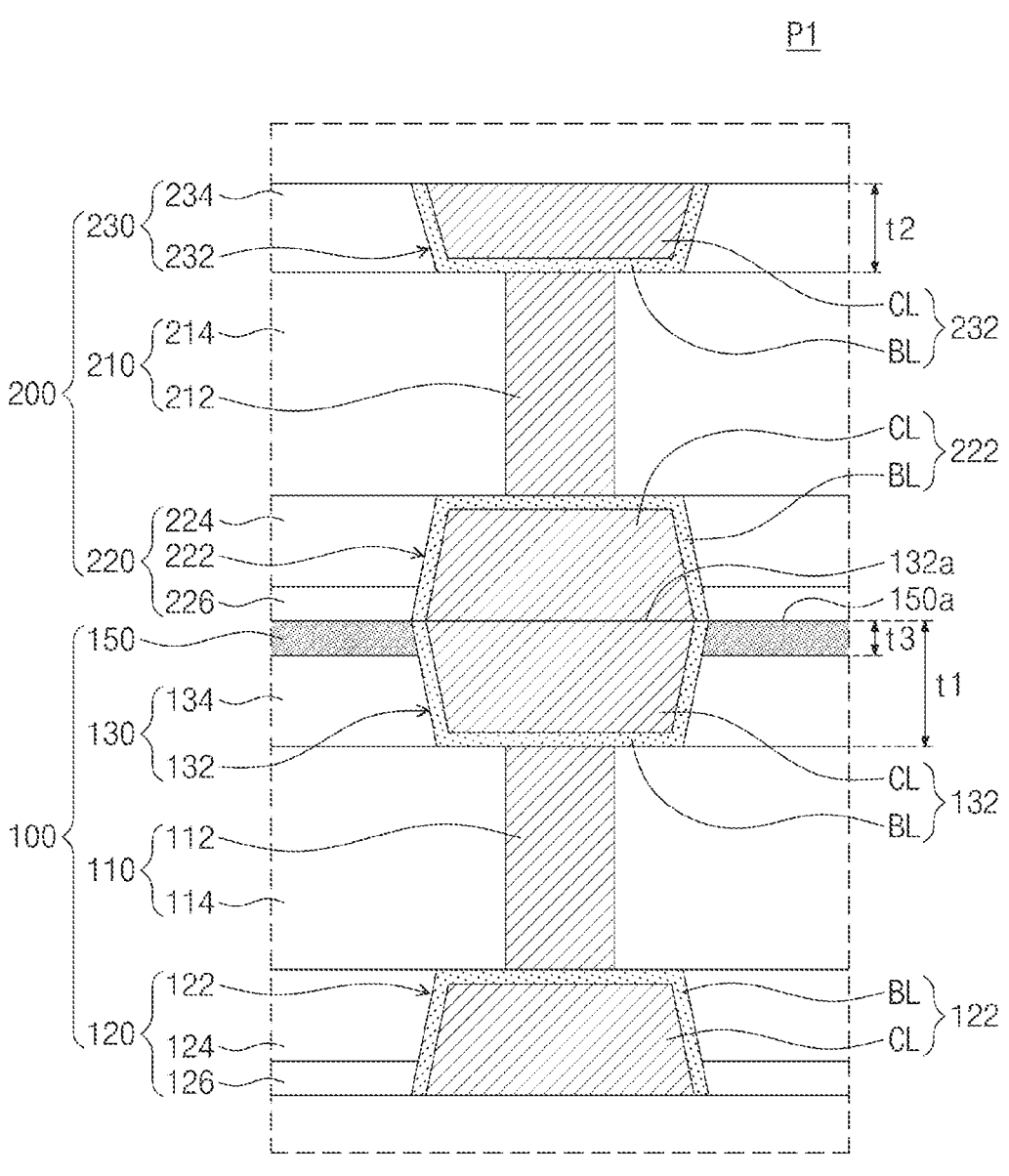
FIGS. 2A and 2B are respective, enlarged views further illustrating a portion 'P1' indicated in the semiconductor device 10 of FIG. 1.
Figure 2B:
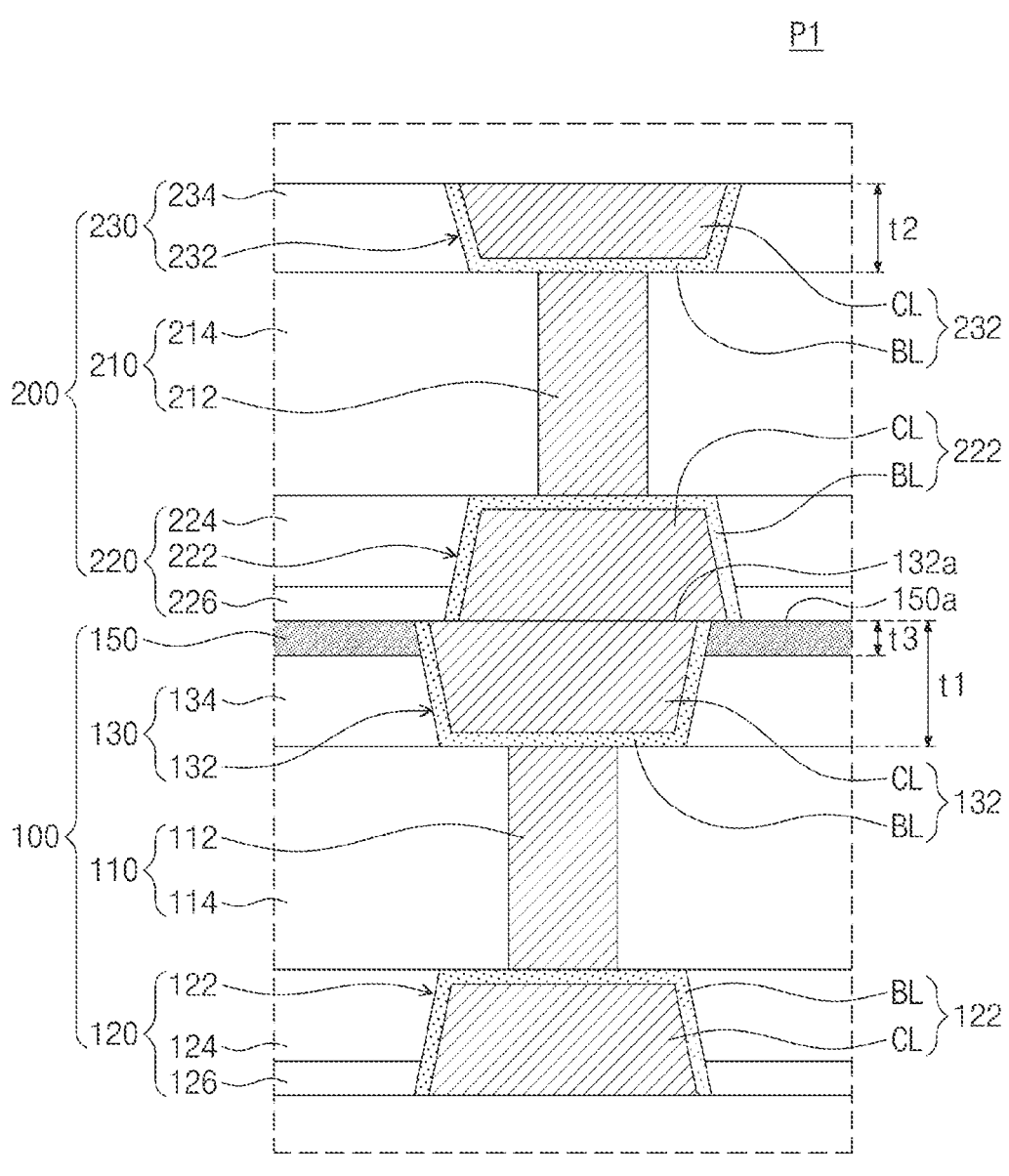
Figure 2C:
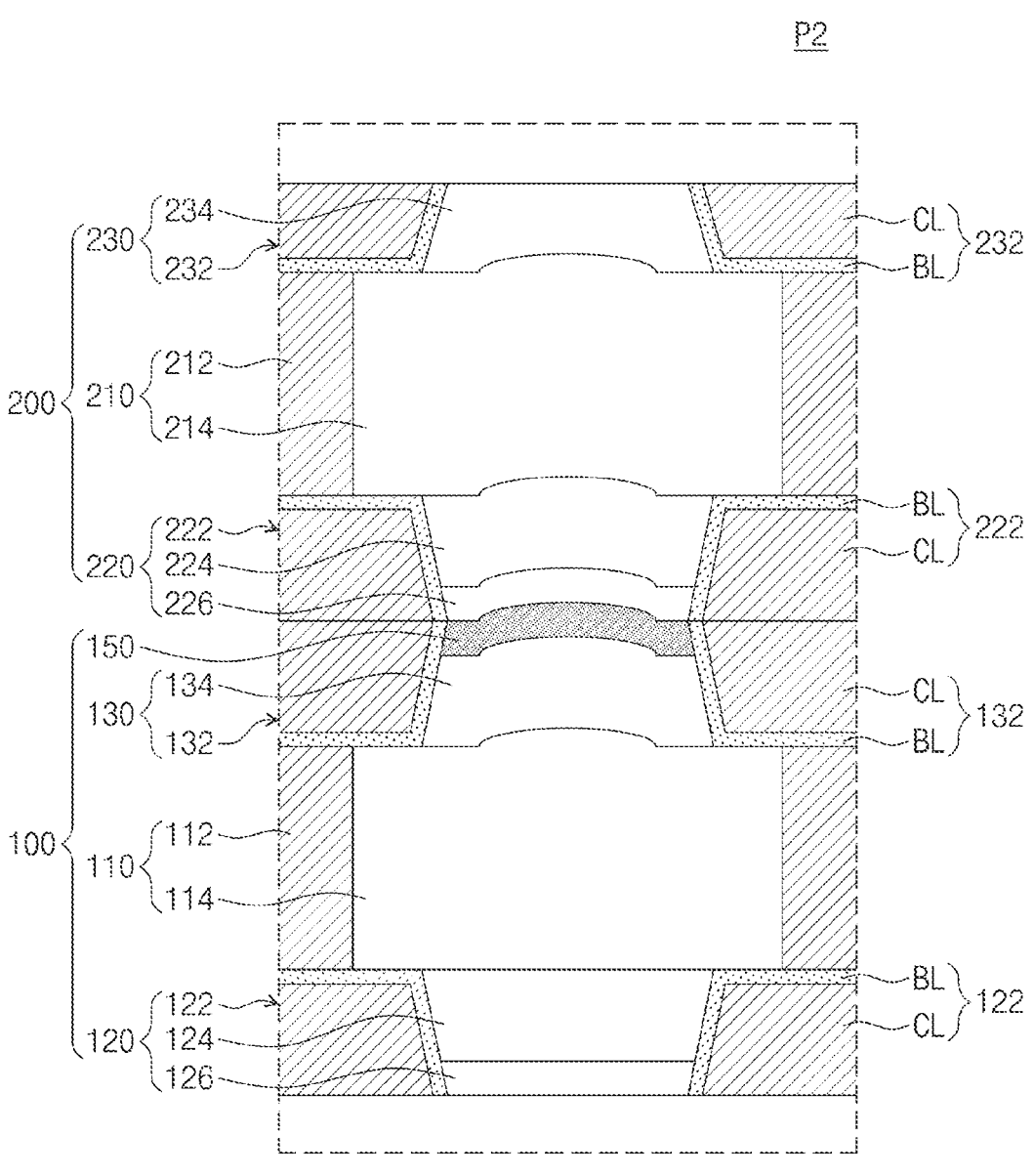
FIG. 2C is an enlarged view further illustrating a portion 'P2' indicated in the semiconductor device 10 of FIG. 1.

Figure (FIG. 1 is a cross-sectional view illustrating a semiconductor device 10 according to embodiments of the inventive concept; FIGS. 2A and 2B are respective enlarged views further illustrating a portion 'P1' indicated in FIG. 1: and FIG. 2C is an enlarged view further illustrating a portion 'P2' indicated in FIG. 1.

Referring to FIGS. 1, 2A and 2B, the semiconductor device 10 may include a chip structure (CS) including a first (or lower) chip 100 and a second (or upper) chip 200 stacked on first chip 100. In this regard, the first and second chips 100 and 200 may be understood as extending in a first (e.g., horizontal) direction D1 and being stacked in a second (e.g., vertical) direction D2 substantially perpendicular to the first direction D1. In some embodiments, each of the first and second chips 100 and 200 may be a memory chip, such as for example, a Dynamic Random Access Memory (RAM) (DRAM) chip, a Synchronous RAM (SRAM) chip, a Magnetic RAM (MRAM) chip, and a flash memory chip. Alternately one or both of the first and second chips 100 and 200 may be a logic chip (e.g., a chip capable of performing data processing and/or computational operations).

Within the foregoing configuration, the first chip 100 and the second chip 200 may hereafter, under certain conditions, be distinguished one from the other in accordance with whether or not a polishing process has been applied during manufacture of the semiconductor device 10. This distinction and its significance will be described in some additional detail hereafter.

In some embodiments, the first chip 100 may be understood as a chip that is "directly" (e.g., without substantial intervening component) mounted on (e.g.,) an assembly substrate (not shown in FIG. 1). Thereafter, a polishing process is not be applied to (or performed on) an upper portion of the first chip 100. In contrast, the second chip 200 may be understood as a chip that is mounted on the assembly substrate 1000 Thereafter, the polishing process is applied to an upper portion of the second chip 200. As used in the foregoing description the term "mounted on" denotes the mechanical assembly and/or electrical connection of two components, such as two chips, or a chip and a substrate.

As illustrated in FIG. 1, for example, the first chip 100 may include a first substrate 110, a first lower bonding layer 120, a first upper bonding layer 130, and a first sacrificial layer 150.

The first substrate 110 may include a semiconductor substrate, such as for example, a bulk silicon substrate, a silicon-on-insulator (SOI) substrate, a germanium substrate, a germanium-on-insulator (GOI) substrate, a silicon-germanium substrate, and/or a substrate including an epitaxial thin layer obtained by use of a selective epitaxial growth (SEG) process. In this regard, the first substrate 110 may include at least one of silicon (Si), germanium (Ge), silicon-germanium (SiGe), gallium arsenic (GaAs), indium gallium arsenic (InGaAs), and/or aluminum gallium arsenic (AlGaAs). Alternately or additionally, the first substrate 110 may include an insulating substrate.

The first substrate 110 may include a first circuit layer 114, and one or more first through-vias 112 penetrating (or extending through) the first circuit layer 114. The first circuit layer 114 may include a first circuit pattern and a first insulating layer covering the first circuit pattern. In some embodiments, the first circuit pattern may include a memory circuit including one or more transistors and/or a logic circuit including one or more transistors. In some embodiments, the first circuit pattern may include one or more passive element(s), such as for example, a resistor, an inductor and/or a capacitor.

The first through-vias 112 may penetrate the first circuit layer 114 (e.g., the first insulating layer associated with the first circuit layer 114) in the second direction D2. The first through-vias 112 may be used to electrically connect one or more first lower pads 122 with one or more first upper pads 132. Those skilled in the art will appreciate that one or more conductive patterns and/or elements may be used to variously interconnect one or more first through-vias 112 with the elements, components and/or portions of the first circuit pattern.

The first lower bonding layer 120 may be disposed on a first (or lower) surface of the first substrate 110. That is, the first lower bonding layer 120 may include one or more first lower pads 122 disposed on the lower surface of the first substrate 110, a first lower insulating layer 124 substantially surrounding at least a first portion (e.g., an upper portion) of the first lower pads 122, and a first lower protective layer 126 substantially surrounding a second portion (e.g., a lower portion) of the first lower pads 122, wherein the first lower insulating layer 124 may be disposed between the first substrate 110 and the first lower protective layer 126.

The first lower pads 122 may be disposed on the lower surface of the first substrate 110 in contact with one or more of the first through-vias 112. For example, each one of the first lower pads 122 may be respectively connected with a corresponding one of the first through-vias 112.

In some embodiments like the ones illustrated in FIGS. 1, 2A and 2B, each of the first lower pads 122 may be characterized by a "width" extending (e.g.,) in the first direction D1 that varies in accordance with a "height" extending in (e.g.,) the second direction D2. For example, the width of a first lower pad 122 may become progressively less as the height of the first lower pad 122 extends towards the first substrate 110.

Referring to FIG. 2A, at least one of the first lower pads 122 may include a conductive layer CL and a barrier layer BL. Here, the conductive layer CL may substantially penetrate the first lower insulating layer 124 in the second direction D2. The barrier layer BL may extend between the conductive layer CL and the first lower insulating layer 124 and may further extend between the conductive layer CL and the first lower protective layer 126. In some embodiments, the conductive layer CL may include a conductive material such as a metal (e.g., copper), whereas the barrier layer BL may include at least one of titanium, tantalum, titanium oxide, tantalum oxide, titanium nitride and/or tantalum nitride.

Thus, the first lower pad 122 may penetrate both the first lower insulating layer 124 and the first lower protective layer 126 in the second direction D2. One surface (e.g., a lower surface) of the first lower pad 122 may be exposed through the first lower protective layer 126 and be substantially coplanar with one surface (e.g., a lower surface) of the first lower protective layer 126.

In some embodiments, the first lower insulating layer 124 may be an insulating layer formed of at least one material, such as for example, silicon oxide, silicon nitride, silicon oxynitride, silicon carbon oxide and silicon carbonitride. The first lower protective layer 126 may include at least one material, such as for example, silicon oxide, silicon nitride, silicon oxynitride, silicon carbon oxide and silicon carbonitride.

The first upper bonding layer 130 may be disposed on an opposing surface (e.g., an upper surface) of the first substrate 110 relative to the first lower bonding layer 120, and may include one or more first upper pads 132 and a first upper insulating layer 134 substantially surrounding at least a portion (e.g., a lower portion) of the first upper pads 132.

The first upper pads 132 may be variously connected to the first through-vias 112 (e.g., each one of the first upper pads 132 may be respectively connected via a corresponding one of the first through-vias 112 to one of the first lower pads 122).

Here also, each of the first upper pads 132 may be characterized by a width extending (e.g.,) in the first direction D1 that varies in accordance with a height extending in (e.g.,) the second direction D2. For example, the width of a first upper pad 132 may become progressively less as the height of the first upper pad 122 extends towards the first substrate 110.

The first upper pad 132 may also include the conductive layer CL and the barrier layer BL, wherein the conductive layer CL penetrate the first upper insulating layer 134 in the second direction D2 and the barrier layer BL extends between the conductive layer CL and the first upper insulating layer 134 and further extends between the conductive layer CL and the first sacrificial layer 150. Thus, the first upper pads 132 may penetrate the first upper insulating layer 134 in the second direction D2.

In some embodiments, the first upper insulating layer 134 may be an insulating layer including at least one material, such as for example, silicon oxide, silicon nitride, silicon oxynitride, silicon carbon oxide and silicon carbonitride.

The first sacrificial layer 150 may be disposed on an upper surface of the first upper insulating layer 134 to substantially surround at least upper portions of the first upper pads 132. That is, at least one first upper pad 132 respectively penetrates the first sacrificial layer 150 in the second direction D2, such that an upper surface 132a of the first upper pad 132 may be exposed through the first sacrificial layer 150 and is substantially coplanar with an upper surface 150a of the first sacrificial layer 150.

Further in this regard, the first sacrificial layer 150 may include at least one material having a polishing selectivity with respect to the material(s) of the first upper insulating layer 134. In some embodiments, the first upper insulating layer 134 may include the same material(s) as a second upper insulating layer 234 described hereafter, and the first sacrificial layer 150 may include at least one material having a polishing selectivity with respect to the second upper insulating layer 234. For example, the first sacrificial layer 150 may include at least one of silicon oxide, silicon carbon oxide and/or a polymer material.

The second chip 200 may include a second substrate 210, a second lower bonding layer 220 and a second upper bonding layer 230, wherein features associated with the second substrate 210 may be substantially the same as similar features associated with the first substrate 110. For some examples, the second substrate 210 may include a semiconductor substrate and/or an insulating substrate.

The second substrate 210 may include a second circuit layer 214, and one or more second through-vias 212 penetrating the second circuit layer 214. The second circuit layer 214 may include a second circuit pattern and a second insulating layer covering the second circuit pattern. Features associated with the second circuit pattern and the second insulating layer of the second circuit layer 214 may be substantially the same as similar features associated with the first circuit pattern and the first insulating layer of the first circuit layer 114.

The second through-vias 212 may penetrate the second circuit layer 214 (e.g., the second insulating layer of the second circuit layer 214) in the second direction D2 to electrically connect second lower pads 222 and second upper pads 232. That is, the second through-vias 212 may contact the second lower pad 222 and the second upper pad 232. As before, those skilled in the art will appreciate that various conductive patterns and/or related elements may be used to variously interconnect the second through-vias 212 and the second circuit pattern.

The second lower bonding layer 220 may be disposed on a surface (e.g., a lower surface) of the second substrate 210. The second lower bonding layer 220 may include second lower pads 222 disposed on the lower surface of the second substrate 210, a second lower insulating layer 224 substantially surrounding at least a portion (e.g., an upper portion) of the second lower pad 222, and a second lower protective layer 226 substantially surrounding another portion (e.g., a lower portion) of the second lower pad 222. The second lower insulating layer 224 may be disposed between second substrate 210 and the second lower protective layer 226. Features of the second lower pad 222, the second lower insulating layer 224 and the second lower protective layer 226 (i.e., features associated with the second lower bonding layer 220) may be at least somewhat similar to the features associated with the first lower pad 122, the first lower insulating layer 124 and the first lower protective layer 126 (i.e., the features associated with the first lower bonding layer 120).

The second lower bonding layer 220 may contact the first sacrificial layer 150 and the first upper bonding layer 130. More particularly, the second lower protective layer 226 of the second lower bonding layer 220 may contact the first sacrificial layer 150. The first sacrificial layer 150 may be disposed between the second lower protective layer 226 of the second lower bonding layer 220 and the first upper insulating layer 134. The second lower pads 222 of the second lower bonding layer 220 may contact the first upper pad 132 of the first upper bonding layer 130. In some embodiments, each of the second lower pads 222 may contact a corresponding one of the first upper pads 132, such that the second lower pads 222 electrically connect the first upper pads 132 through respective, direct contact with the first upper pads 132 (e.g., without substantial intervening component or material).

Accordingly, at least a substantial portion of each second lower pad 222 may vertically overlap a corresponding first upper pad 132. In some embodiments, as shown in FIG. 2A, the second lower pad 222 may wholly, (or completely) overlap in the second direction D2 the corresponding first upper pad 132. However, in certain embodiments like the one illustrated in FIG. 2B, at least a portion of the second lower pad 222 may not vertically overlap a portion of the first upper pad 132. And in such a case, some portion of the second lower pad 222 will contact a portion of the first sacrificial layer 150, and some portion of the first upper pad 132 will contact the second lower protective layer 226.

The second upper bonding layer 230 may be disposed on an opposing surface (e.g., an upper surface) of the second substrate 210 relative to the second lower bonding layer 220. The second upper bonding layer 230 may include one or more second upper pads 232 and the second upper insulating layer 234 substantially surrounding at least a portion of the second upper pads 232. Here, features of the second upper pad 232 and the second upper insulating layer 234 (i.e., features associated with the second upper bonding layer 230) may be at least somewhat similar to features of the first upper pad 132 and the first upper insulating layer 134 (i.e., features associated with the first upper bonding layer 130).

The second upper insulating layer 234 may substantially surround at least a portion of the second upper pad 232. For example, the second upper insulating layer 234 may substantially surround a side surface of the second upper pad 232. One surface (e.g., an upper surface) of the second upper pad 232 may be exposed through the second upper insulating layer 234 and be substantially coplanar with one surface (e.g., an upper surface) of the second upper insulating layer 234.

In some embodiment, the second upper pads 232 may be electrically connected to the first lower pads 122. For example, the second upper pads 232 may be respectively and electrically connected to the first lower pad 122 through a corresponding second through-via 212, a corresponding second lower pad 222, a corresponding first upper pad 132 and a corresponding first through-via 112. In some embodiments, each of the second upper pads 232 may be electrically connected to a corresponding one of the first lower pads 122. For example, each of the second upper pads 232 may be respectively and electrically connected to a corresponding first lower pad 122 through a corresponding second through-via 212, a corresponding second lower pad 222, a corresponding first upper pad 132 and a corresponding first through-via 112.

Of further note, a second "thickness" t2 of the second upper pad 232 (as measured in the second direction D2) may be less than a first thickness t1 of the first upper pad 132. More particularly, a second thickness t2 for a second upper pad 232 may be less than a first thickness t1 of a corresponding first upper pad 132. In some embodiments, a second thickness for a second upper pad 232 may be about 90% or more of a first thickness for the corresponding first upper pad 132. That is, the first thickness t1 for the first upper pad 132 may be greater than the second thickness t2 for the second upper pad 232 by a third thickness t3 associated with the first sacrificial layer 150. In some embodiments, the third thickness t3 of the first sacrificial layer 150 may range from between about 1000 Å to about 2000 Å.

Referring to FIGS. 1 and 2C, an upper surface of the first chip 100 may have an nonlinear (or uneven) profile. Thus, a height of an upper surface of the first chip 100 may vary in accordance with lateral position along the first direction D1. In this context, the either of the terms "height" and "level" may be understood as a vertical position (e.g., measured in the second direction D2) relative to an arbitrarily selected horizontal (or lateral) plane (e.g., a defined surface, such as for example, the upper surface of the first chip 100, the lower surface of the first chip 100, etc.).

In some embodiments like the one illustrated in FIG. 2C, a portion of the upper surface of the first sacrificial layer 150 of the first chip 100 may extend (or protrude) upwardly towards the second chip 200. Alternately or additionally in some embodiments, another portion of the upper surface of the first sacrificial layer 150 of the first chip 100 may extend (or be recessed) downwardly away from the second chip 200.

In contrast the upper surface of the second chip 200 may have a substantially linear (or flat) profile, such that the height of the upper surface of the second chip 200 does not vary with position along the first direction D1. In this regard, the overall height of the upper surface of the second chip 200 may be defined in relation to the lowermost surface of the second chip 200. For example, upper surfaces of the second upper pads 232 may be substantially the same height (or level) as the upper surface of the second upper insulating layer 234, as shown for example in FIG. 2C. However, the profiles and level dispositions of surfaces associated with other elements and components of the second chip 200 may vary by design. For example, an upper surface and a lower surface of the second lower bonding layer 220 of the second chip 200 may be uneven along the profile of the upper surface of the first chip 100, but embodiments of the inventive concept are not limited thereto.

Assuming a case in which a second chip structure is stacked on the first chip structure CS, the first and second chip structures may be readily bonded together using the substantially flat upper surface of the second chip 200 of the first chip structure, even though the profile of the upper surface of the first chip 100 may be notably uneven. As a result, various conductive pads associated with a semiconductor device including a first and second chip structure according to embodiments of the inventive concept may be readily and correctly fabricated, thereby providing improved overall electrical performance and better driving stability.

Figure 3:
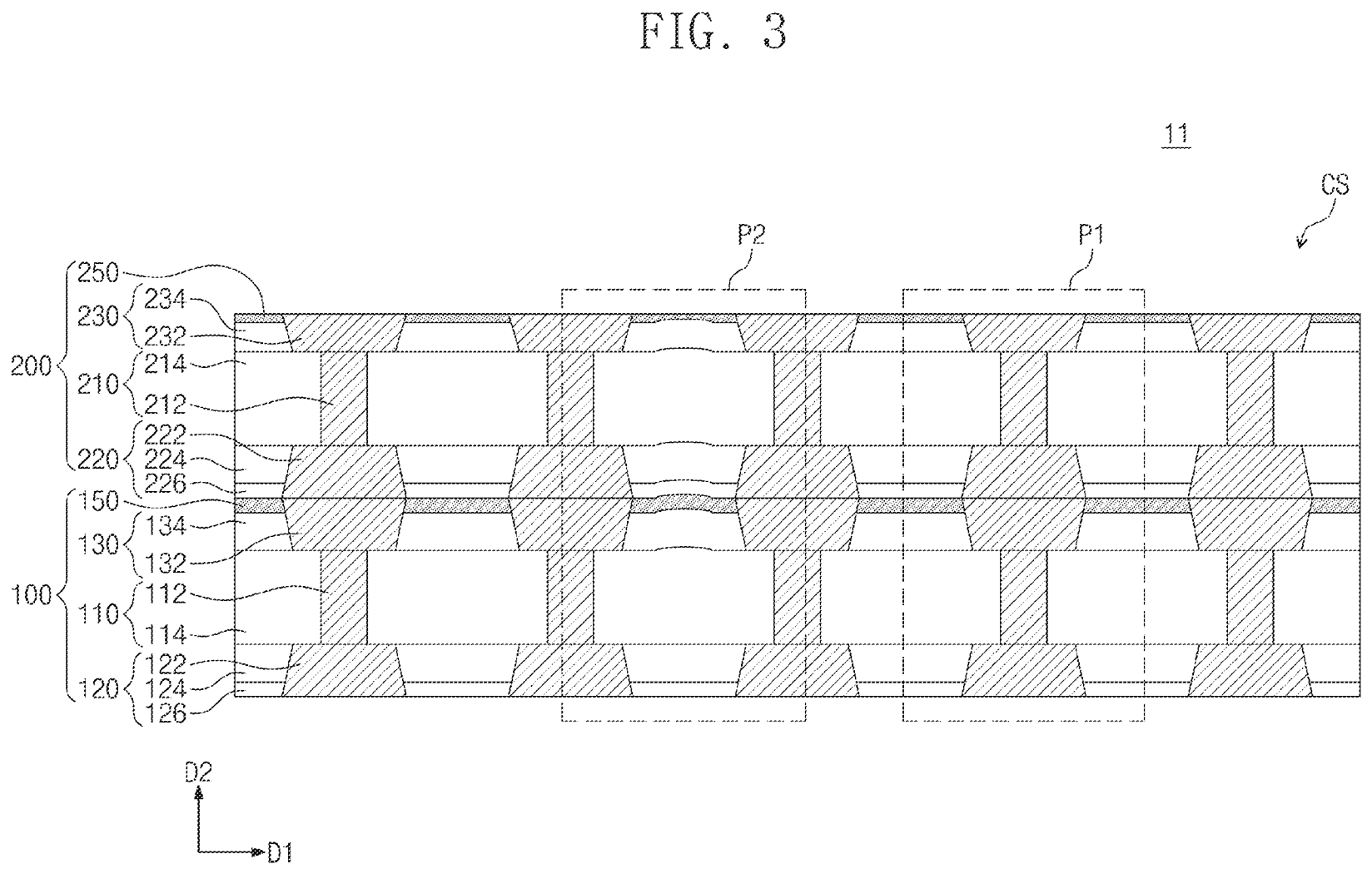
Figure 4A:
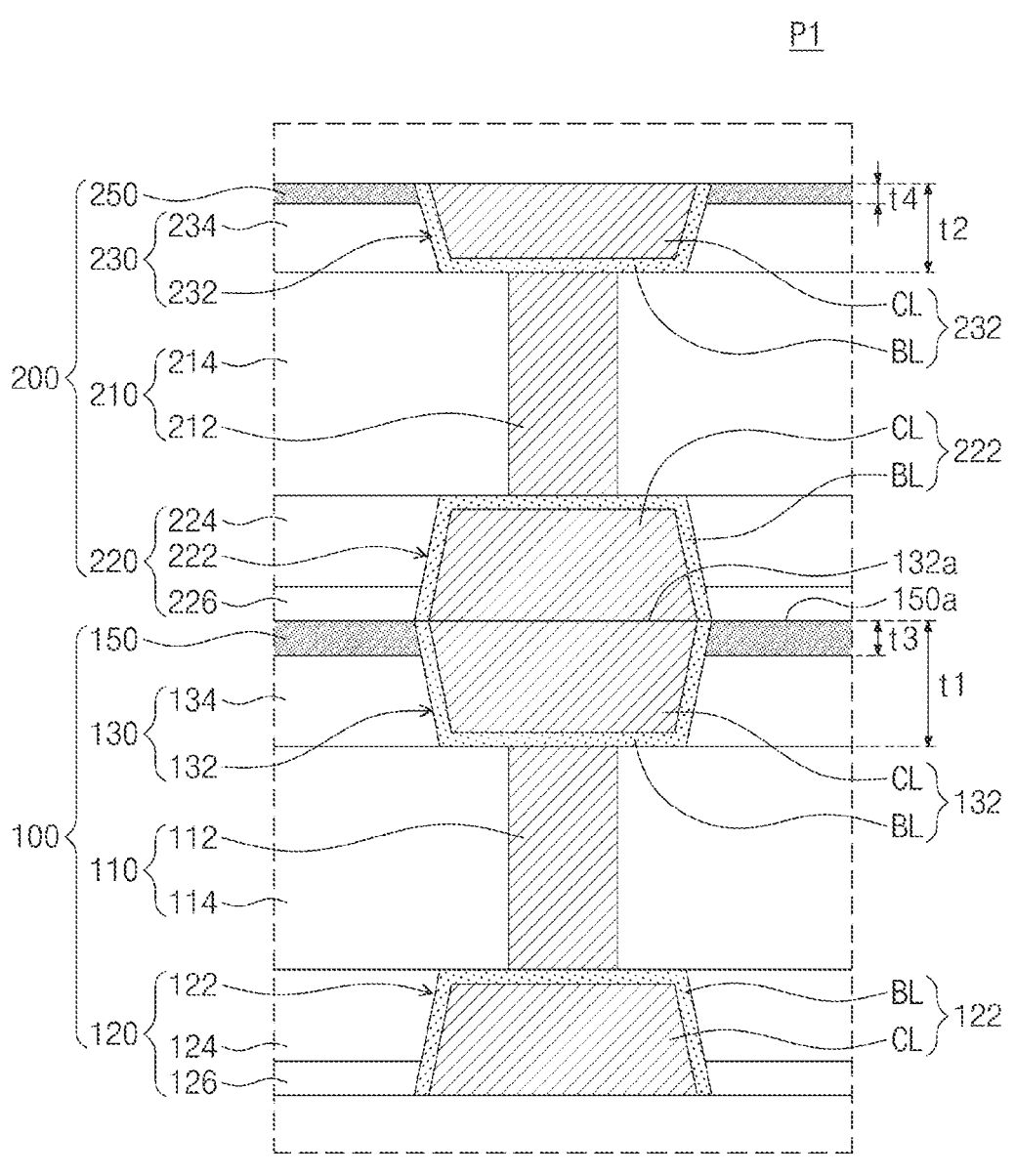
FIG. 4A is an enlarged view further illustrating a portion 'P1' indicated in the semiconductor device 11 of FIG. 3, and FIGS. 4B and 4C are respective, enlarged views further illustrating a portion 'P2' indicated in the semiconductor device 11 of FIG. 3.

FIG. 3 is a cross-sectional view illustrating a semiconductor device 11 according to embodiments of the inventive concept; FIG. 4A is an enlarged view further illustrating a portion 'P1' indicated in FIG. 3; and FIGS. 4B and 4C are respective enlarged views further illustrating a portion 'P2' indicated in FIG. 3.

Referring to FIGS. 3 and 4A, the second chip 200 may include a second sacrificial layer 250. That is, the second sacrificial layer 250 may be disposed on the second upper insulating layer 234 to substantially surround a portion (e.g., an upper portion) of the second upper pad 232, and the second upper insulating layer 234 may substantially surround another portion (e.g., a lower portion) of the second upper pad 232. One surface (e.g., the upper surface) of the second upper pad 232 may be exposed through the second sacrificial layer 250 and be substantially coplanar with an upper surface of the second sacrificial layer 250.

Here, a fourth thickness t4 of the second sacrificial layer 250 may be less than the third thickness t3 of the first sacrificial layer 150. For example, the fourth thickness t4 of the second sacrificial layer 250 may range from between greater than OA to less than or equal to about 2000 Å. In some embodiments, the second sacrificial layer 250 may include the same one or more material(s) as the first sacrificial layer 150, wherein the one or more material(s) have a polishing selectivity with respect to the first and second upper insulating layers 134 and 234. In this regard, the second sacrificial layer 250 may include at least one of for example; silicon oxide, silicon carbon oxide and a polymer material.

Figure 4B:
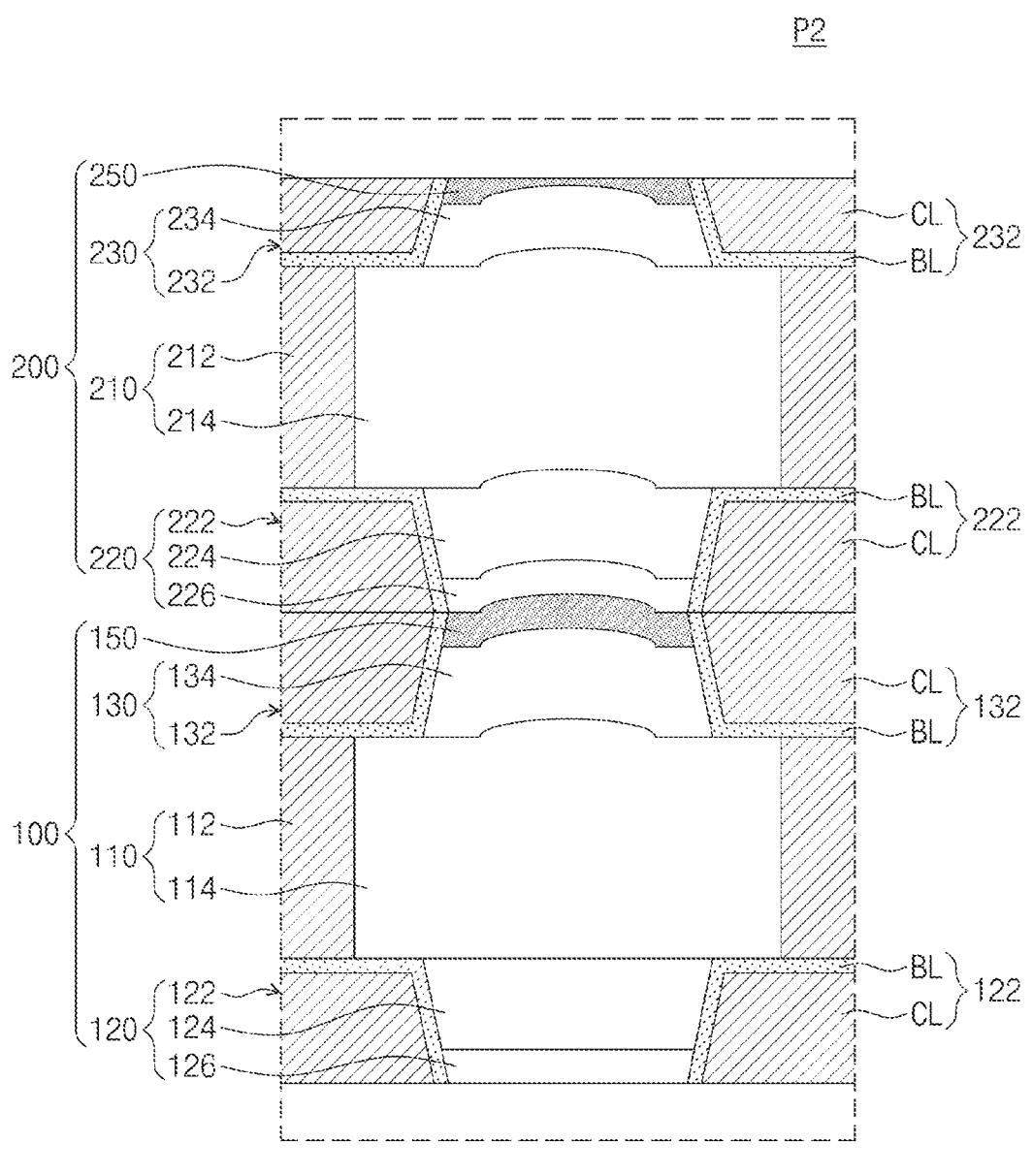
Figure 4C:
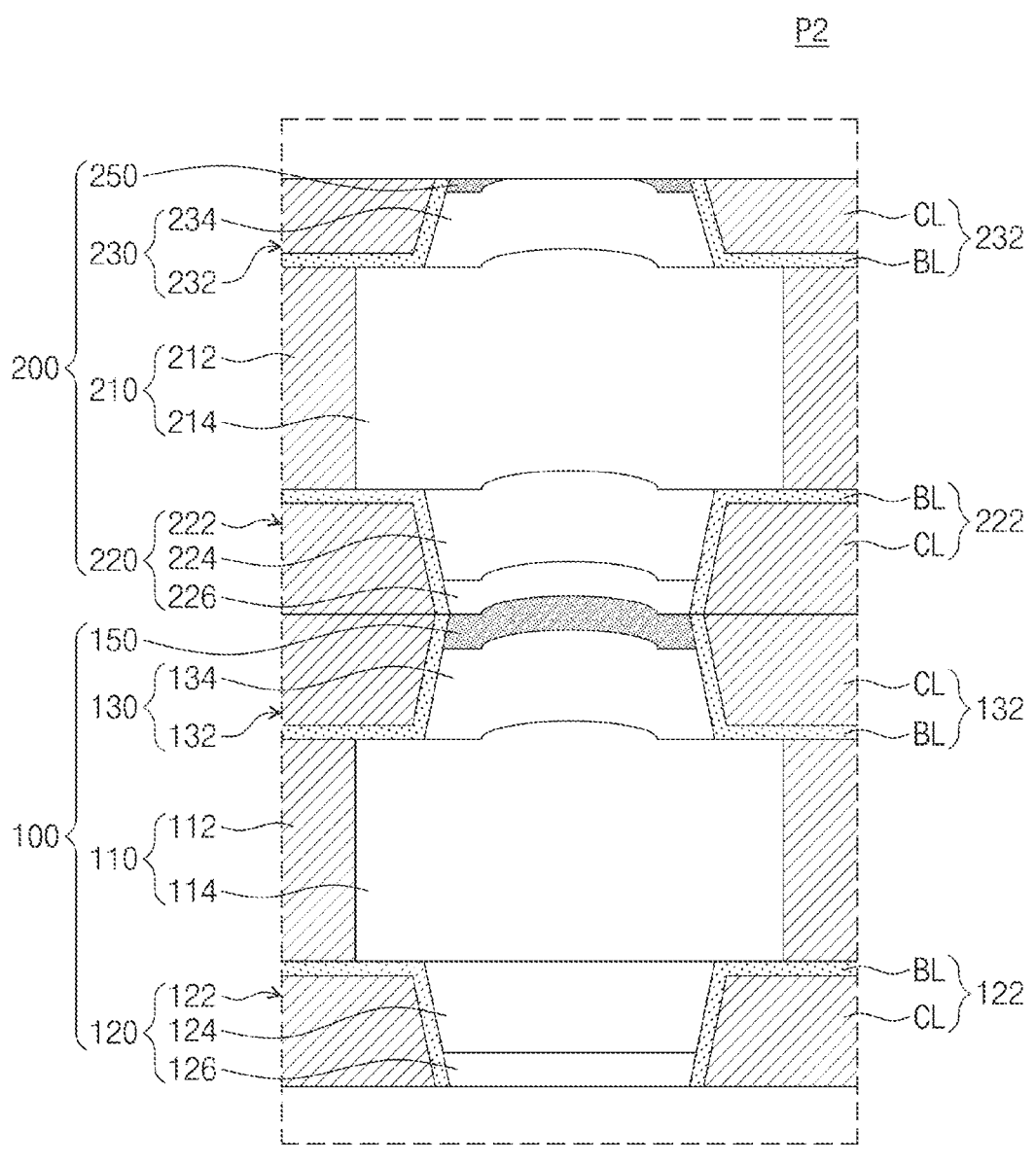

Referring to FIGS. 3, 4B and 4C, an upper surface of the second chip 200 may have a substantially flat profile. That is, the height of the upper surface of the second chip 200 at any given position along the first direction D1 is substantially uniform. Here again, the height of the upper surface of the second chip 200 may be defined in relation to the a lowermost surface of the second chip 200.

In some embodiments like the one shown in FIG. 4B, the upper surface of the second chip 200 may include the upper surface of the second upper pad 232 and the upper surface of the second sacrificial layer 250, wherein the second upper insulating layer 234 is disposed between the second sacrificial layer 250 and the second substrate 210 and is completely covered by the second sacrificial layer 250. In this regard, the upper surface of the second upper insulating layer 234 may have a height that is lower than the upper surface of the second upper pad 232.

In some embodiments like the one shown in FIG. 4C and in contrast to the embodiment illustrated in FIG. 4B, the upper surface of the second chip 200 may further include an upper surface of the second upper insulating layer 234. That is, a portion of the upper surface of the second upper insulating layer 234 may be exposed by the second sacrificial layer 250 and may form a portion of the upper surface of the second chip 200. The exposed upper surface of the second upper insulating layer 234 may be disposed at substantially the same height as the upper surface of the second sacrificial layer 250 and may be substantially coplanar with the upper surface of the second sacrificial layer 250.

FIG. 5 is a cross-sectional view illustrating a semiconductor device 12 according to embodiments of the inventive concept.

Referring to FIG. 5, a chip structure CS of the semiconductor device 12 may include a plurality of the stacked first chips 100, together with the second chip 200 stacked on the plurality of first chips 100. In this regard, an upper first chip 100 may be stacked on a lower first chip 100, and the second chip 200 may be stacked on the upper first chip 100. Since the chip structure CS includes the plurality of first chips 100, the chip structure CS includes a plurality of the first sacrificial layers 150, wherein an uppermost one of the first sacrificial layers 150 is disposed between the first upper bonding layer 130 (e.g., the first upper insulating layer 134) of the uppermost first chip 100 and the second lower bonding layer 220 (e.g., the second lower protective layer 226) of the second chip 200. The other first sacrificial layers 150 may be disposed between the first upper bonding layer 130 (e.g., the first upper insulating layer 134) of the upper first chip 100 and the first lower bonding layer 120 (e.g., the first lower protective layer 126) of the lower first chip 100. As illustrated in FIG. 5, the second chip 200 may not include the second sacrificial layer 250, but this need not always be the case and in some embodiments the second chip may include the second sacrificial layer 250.

FIGS. 6, 7, 8A and 8B are respective cross-sectional views illustrating various semiconductor devices 13, 14, 15 and 16 according to embodiments of the inventive concept.

Referring to FIGS. 6, 7, 8A and 8B, each of the semiconductor devices 13, 14, 15 and 16 includes a chip stack CST, wherein the chip stack CST includes a plurality of stacked chip structures CS (e.g., a first chip structure CS1 and a second chip structure CS2 stacked on the first chip structure CS1). Here, each of the first and second chip structures CS1 and CS2 may be implemented, for example, in accordance with one of the chip structures CS previously described in relation to FIGS. 1, 2A, 2B. 2C, 3, 4A, 4B, 4C and 5. In some embodiments, the first and second chip structures CS1 and CS2 may similar in configuration and type of constituent component(s), but in other embodiments the first and second chip structures CS1 and CS2 may vary in configuration and/or type of constituent component(s).

The second upper pad 232 of the first chip structure CS1 may contact and electrically connect the first lower pad 122 of the second chip structure CS2. The first lower pad 122, the first upper pad 132, the second lower pad 222 and the second upper pad 232 of the first chip structure CS1 may be electrically connected to the first lower pad 122, the first upper pad 132, the second lower pad 222 and the second upper pad 232 of the second chip structure CS2, and the first and second through-vias 112 and 212 of the first and second chip structures CS1 and CS2 may electrically connect them.

Figure 6:
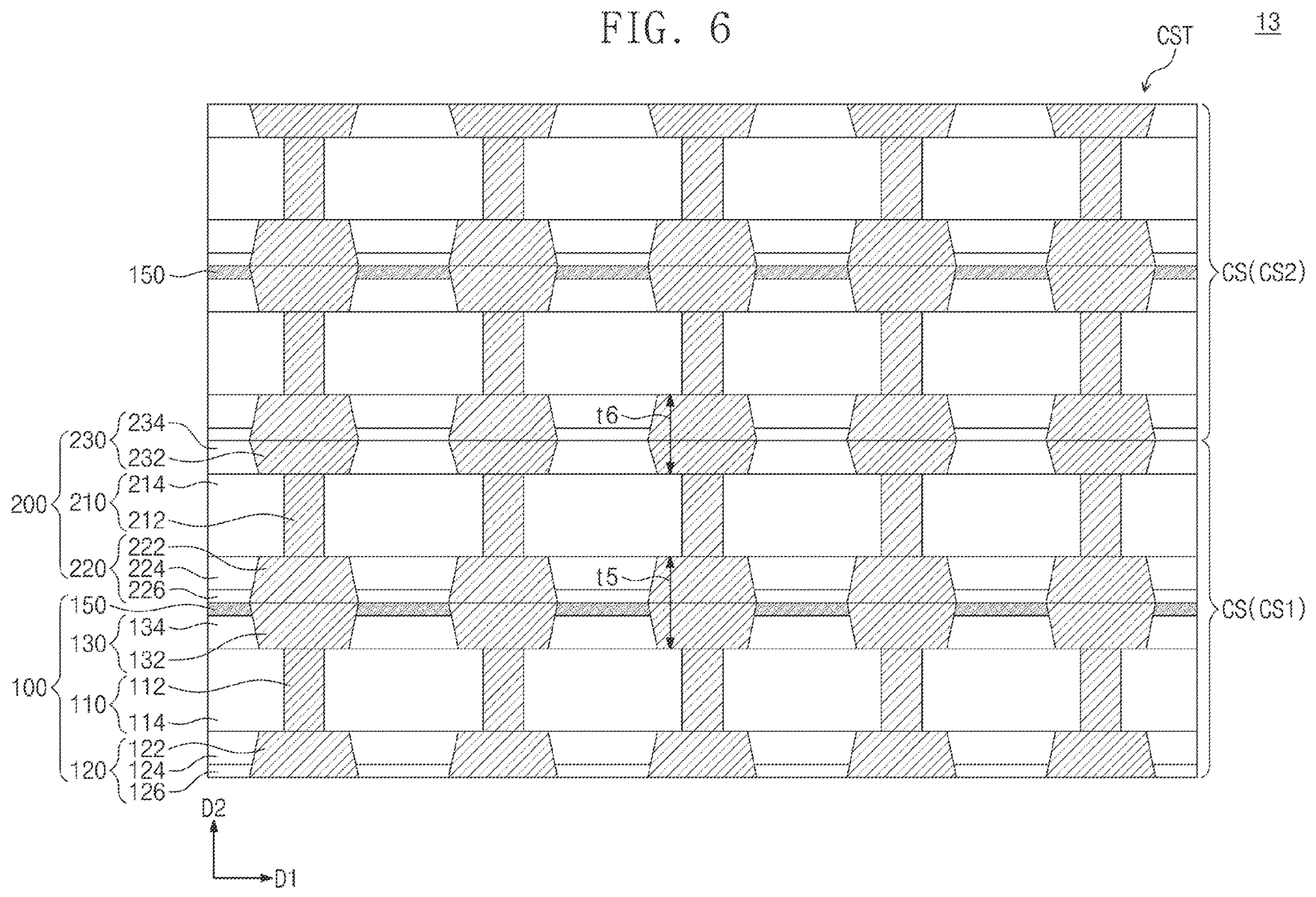

In each of the first and second chip structures CS1 and CS2, the one or more first upper pads 132 and the one or more second lower pads 222 are disposed directly in contact to constitute a first pad structure. Accordingly one or more first pad structures may be provided. Similarly, the one or more second upper pads 232 of the first chip structure CS1 and the one or more first lower pads 122 of the second chip structure CS2 may constitute respective second pad structures. Referring to FIG. 6, a fifth thickness t5 associated with of a first pad structure may be greater than a sixth thickness t6 associated with a second pad structure.

The second chip 200 of the first chip structure CS1 and the second chip 200 of the second chip structure CS2 may be vertically spaced apart (e.g., in the second direction D2). At least one first chip 100 including the first sacrificial layer 150 may be disposed between the second chip 200 of the first chip structure CS1 and the second chip 200 of the second chip structure CS2.

In some embodiments like the one shown in FIG. 6, the second chip 200 of each of the first and second chip structures CS1 and CS2 may not include the second sacrificial layer 250. Therefore, the second upper bonding layer 230 of the first chip structure CS1 and the first lower bonding layer 120 of the second chip structure CS2 may directly contact each other without and intervening second sacrificial layer 250. That is, the second upper insulating layer 234 of the first chip structure CS1 may directly contact the first lower insulating layer 124 of the second chip structure CS2.

Figure 7:
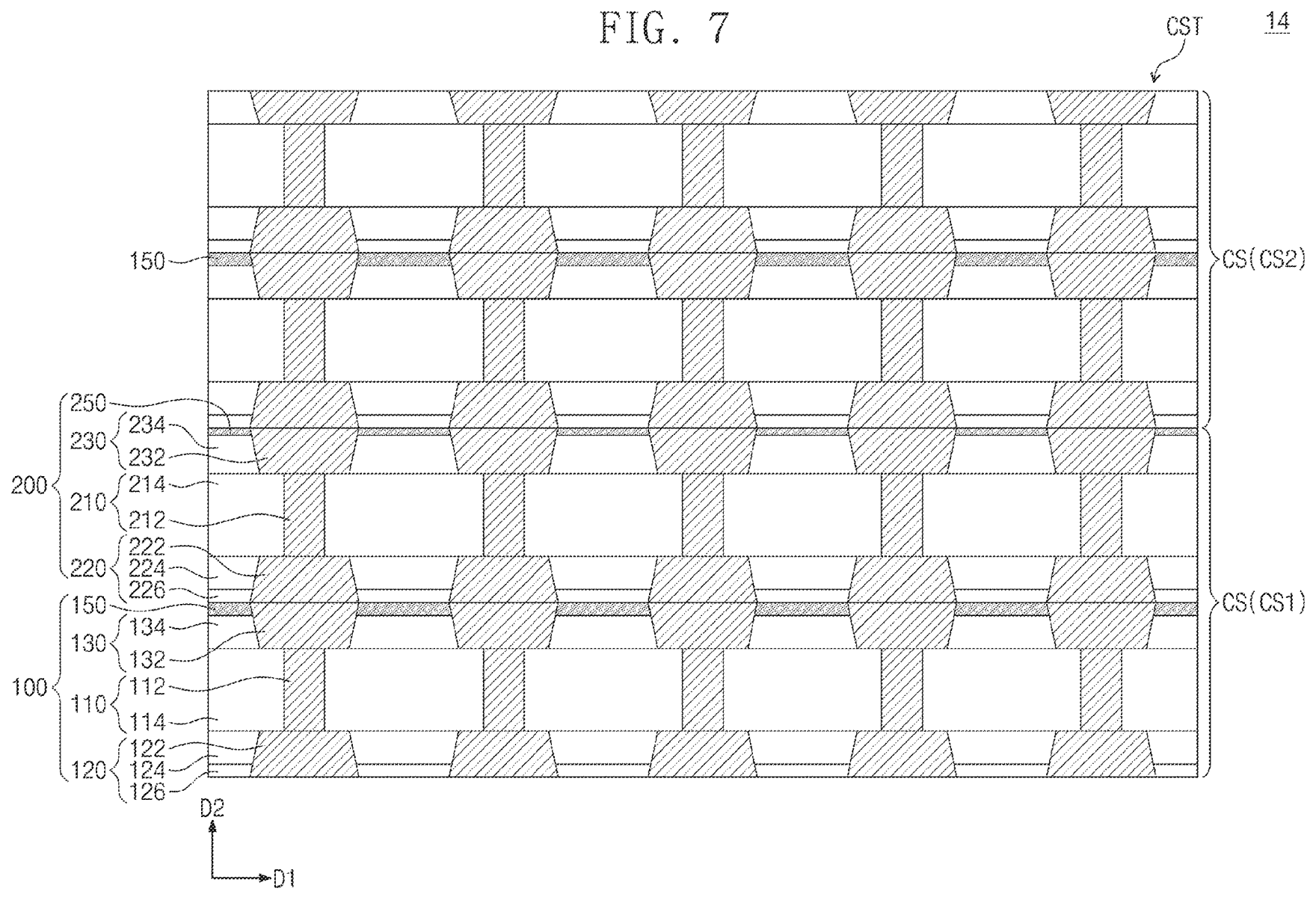

However, in some embodiments like the one shown in FIG. 7 and in contrast to the embodiment illustrated in FIG. 6, the first chip structure CS1 may include the second sacrificial layer 250. That is, the second sacrificial layer 250 may be disposed between the second upper bonding layer 230 (e.g., the second upper insulating layer 234) of the first chip structure CS1 and the first lower bonding layer 120 (e.g., the first lower protective layer 126) of the second chip structure CS2. In some embodiment, the second chip structure CS2 may not include the second sacrificial layer 250, but this need not always to the case and in other embodiments of the inventive concept the second chip structure CS2 may include the second sacrificial layer 250.

Figure 8A:
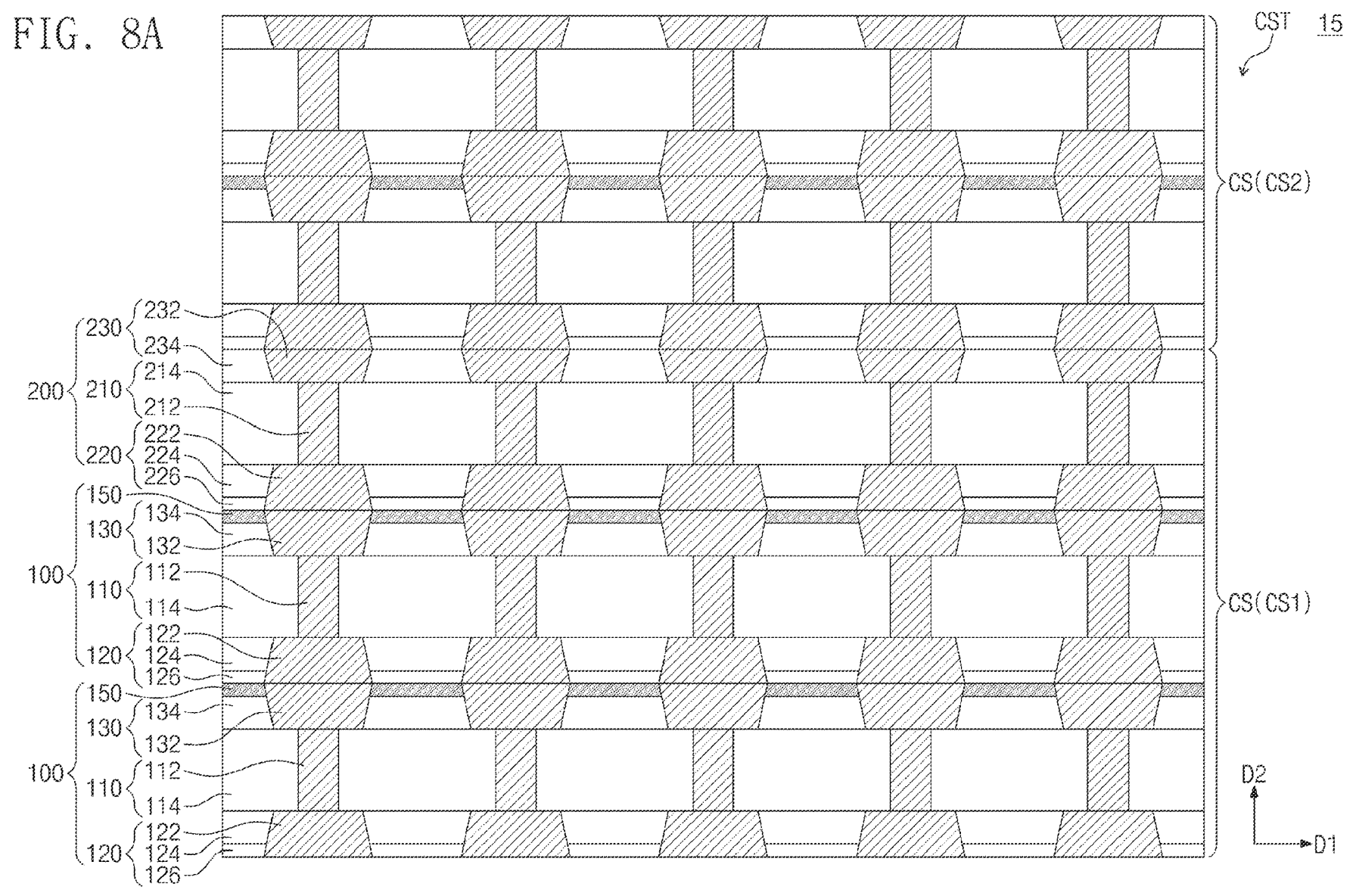
Figure 8B:
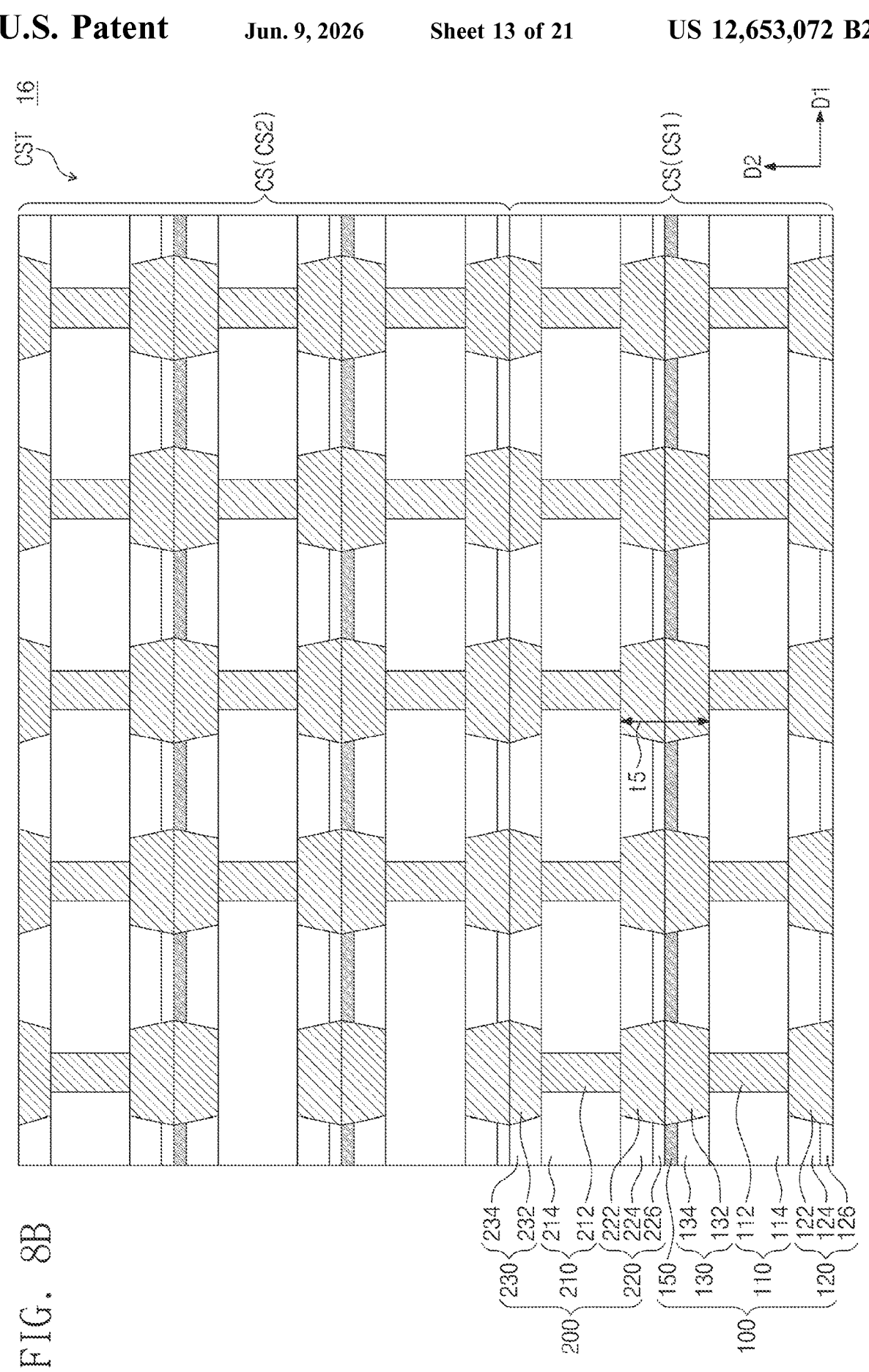

Referring to FIGS. 8A and 8B, each of the chip structures CS1 and CS2 associated with the semiconductor devices 15 and 16 may include more than one first chip 100. For example, as shown in FIG. 8A, the first chip structure CS1 may include a stacked plurality of first chips 100, and the second chip 200 stacked on an uppermost one of the stacked plurality of first chips 100.

In some embodiments, the second chip structure CS2 may include a single first chip 100 and a single second chip 200.

Alternately, in other embodiments like the one shown in FIG. 8B, the second chip structure CS2 may include a stacked plurality of the first chips 100 and the second chip 200 stacked on the uppermost one of the stacked plurality of first chips 100, and the first chip structure CS1 may include a single first chip 100 and a single second chip 200.

Figure 9:
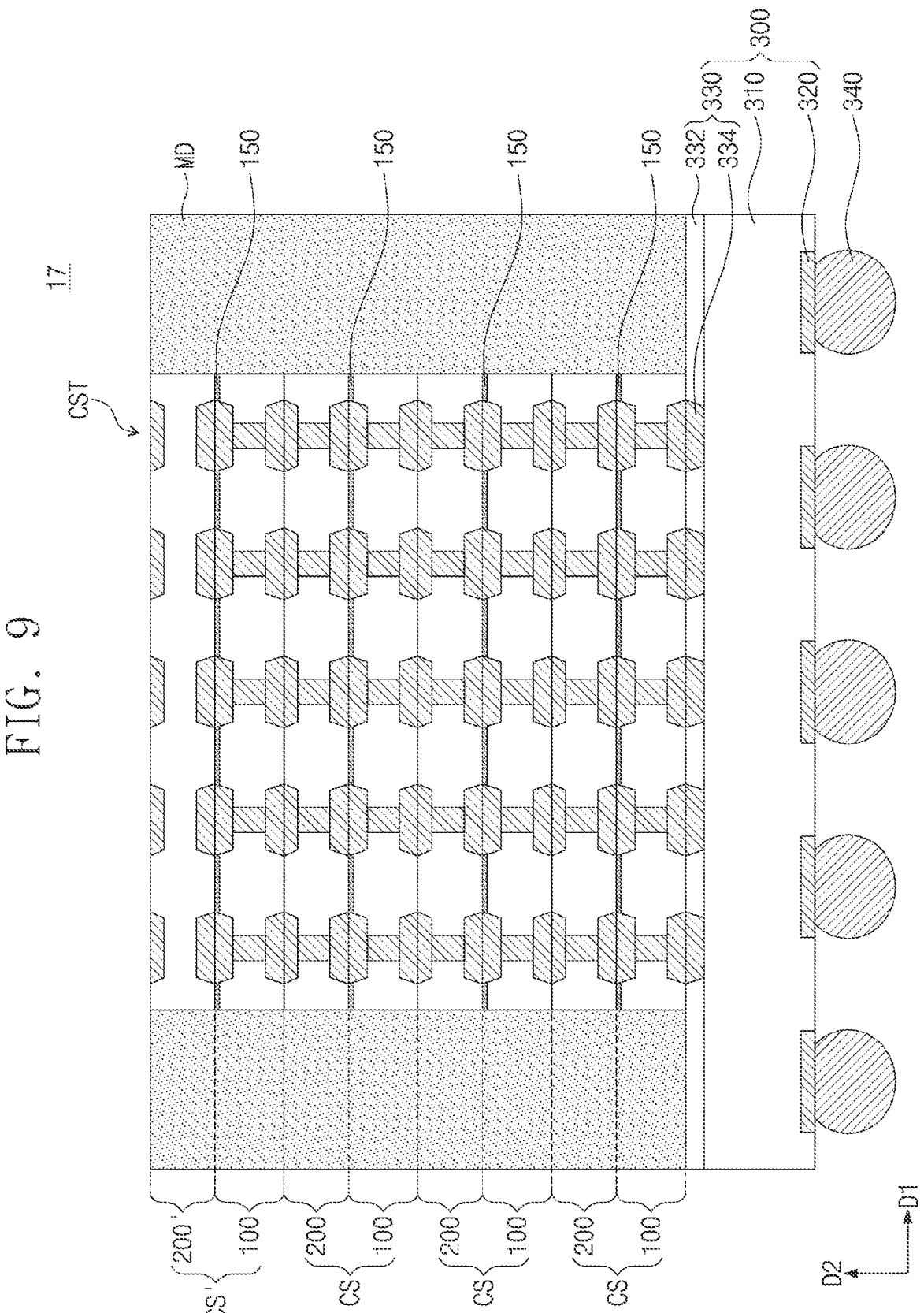

FIG. 9 is a cross-sectional view illustrating a semiconductor device 17 according to embodiments of the inventive concept.

Referring to FIG. 9, a base substrate 300 may be variously provided as a package substrate (e.g., a PCB or an interposer substrate). Alternately, the base substrate 300 may be a semiconductor substrate on which one or more semiconductor devices are integrated. The base substrate 300 may include a base layer 310, an upper interconnection layer 330 formed on one surface (e.g., an upper surface) of the base layer 310, and one or more lower base pads 320 exposed at another surface (e.g., a lower surface) of the base layer 310.

The upper interconnection layer 330 may include one or more upper base pads 334 and a base protective layer 332 substantially surrounding the upper base pads 334. The base protective layer 332 may cover the base layer 310 and may expose an upper surface of the upper base pad 334. An upper surface of the base protective layer 332 may be substantially coplanar with the upper surface of the upper base pad 334.

The base substrate 300, among other possible functions, may serve as a redistribution component in relation to a chip stack CST formed thereon. Thus, the upper base pads 334 and the lower base pads 320 may be variously and electrically interconnected through a circuit interconnection line in the base layer 310 to provide a redistribution circuit and/or one or more circuit interconnection line(s). In this regard, for example, the upper base pads 334 and the lower base pads 320 may include a conductive material, such as a metal (e.g., copper). The base protective layer 332 may include at least one of for example; silicon oxide, silicon nitride, silicon oxynitride, silicon carbon oxide and silicon carbonitride.

One or more base connection terminals 340 may be provided on a lower surface of the base substrate 300 (e.g., a lower surface of the lower base pad 320). Each of the base connection terminals 340 may be disposed on and electrically connected to a corresponding one of the lower base pads 320. The base connection terminals 340 may include, for example, solder balls and/or solder bumps.

The chip stack CST associated with the semiconductor device 17 of FIG. 9 may be disposed on the upper interconnection layer 330 and include a stacked plurality of chip structures (e.g., CS, CS, CS and CS') consistent, for example, with one of the embodiments previously described in relation to FIGS. 6, 7, 8A and 8B. Here, the chip stack CST associated with the semiconductor device 17 of FIG. 9 is assumed to include four (4) chip structures CS, CS, CS and CS', but embodiments of the inventive concept are not limited thereto. Each of the respectively different chip structures (e.g., CS and CS') may be implemented consistent with, for example, one of the chip structures previously described in relation to FIGS. 1, 2A, 2B, 2C, 3, 4A, 4B, 4C and 5.

Components associated with the uppermost chip structure CS' may be at least partially different than components associated with the other chip structure CS. For example, a second chip 200' of the uppermost chip structure CS' may omit the second through-vias 212, but embodiments of the inventive concept are not limited thereto. Further, each one of the other chip structure CS may include the same components or different components.

A molding layer MD may be provided on the base substrate 300 to cover at least a portion of an upper surface of the base substrate 300 and surround at least in part the chip stack CST. Accordingly, the molding layer MD may cover a side surface of the chip stack CST and/or an upper surface of the chip stack CST in order to protect the chip stack CST. The molding layer MD may include an insulating material, such as for example, an epoxy molding compound (EMC).

As shown in FIG. 9, the chip stack CST is directly mounted on the base substrate 300, but embodiments of the inventive concept are not limited thereto. In some embodiments, the chip stack CST may be mounted on another semiconductor chip. The semiconductor chip may be a wafer-level semiconductor substrate formed of a semiconductor (e.g., silicon) and may include an integrated circuit. Here, the integrated circuit may include a memory circuit, a logic circuit, or a combination thereof.

Figure 10:
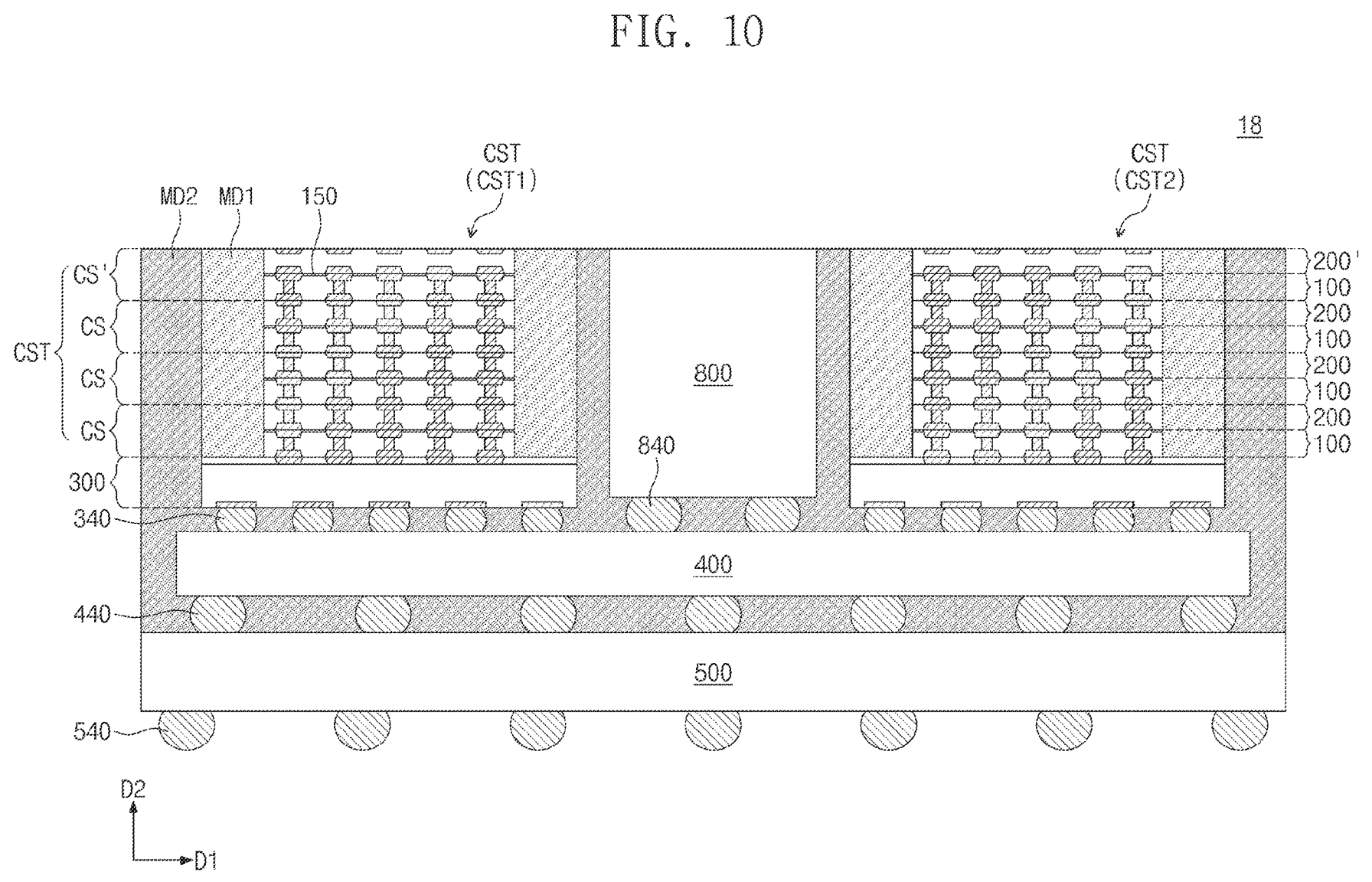

FIG. 10 is a cross-sectional view illustrating a semiconductor device 18 according to embodiments of the inventive concept.

Referring to FIG. 10, the semiconductor device 18 may include a package substrate 500 (e.g., a PCB), and one or more package connection terminals 540 disposed on one surface (e.g., a lower surface) of the package substrate 500. The semiconductor device 18 may be mounted on an external device (e.g., a main board) through the package connection terminal 540.

An interposer 400 may be disposed on another surface (e.g., an upper surface) of the package substrate 500, wherein one or more intermediate connection terminals 440 may be disposed between the package substrate 500 and the interposer 400. The intermediate connection terminals 440 may variously and electrically connect the interposer 400 to the package substrate 500.

A plurality of chip stacks CST (e.g., a first chip stack CST1 and a second chip stack CST2) and a processor chip 800 may be disposed on the interposer 400. A first molding layer MD1 may substantially surround each of the chip stacks CST. The base substrate 300 and the base connection terminal 340 may be disposed between each of the chip stacks CST and the interposer 400. A second molding layer MD2 may substantially surround the interposer 400, the plurality of chip stacks CST and the processor chip 800 on the package substrate 500. One or more base connection terminals 340 may variously and electrically connect the interposer 400 to the base substrate 300. For example, the processor chip 800 may be a graphic processing unit (GPU) or a central processing unit (CPU). One or more processor connection terminals 840 may be disposed between the processor chip 800 and the interposer 400 to electrically connect the processor chip 800 with the interposer 400.

The first chip stack CST1 and the second chip stack CST2 may be spaced apart in the first direction D1. Each of the first and second chip stacks CST1 and CST2 may be implemented in accordance with one of the chip stacks CST described in relation to FIG. 9 and may include a stacked plurality of chip structures CS and CS'.

Features associated with the constituent chips of the first and second chip stacks CST1 and CST2 may be substantially the same. More particularly, the stacking arrangement orders for first chip(s) 100 and second chip(s) 200 of the first and second chip stacks CST1 and CST2 may be the same, and/or a number of the first and second chip(s) 100 and 200 of the first and second chip stacks CST1 and CST2 may be equal or different to each other. For example, the same type of chips may be disposed at the same respective layers in the first and second chip stacks CST1 and CST2. Here, for example, at least one first chip 100 may be disposed between the second chips 200 adjacent to each other in the second direction D2.

Figure 11:
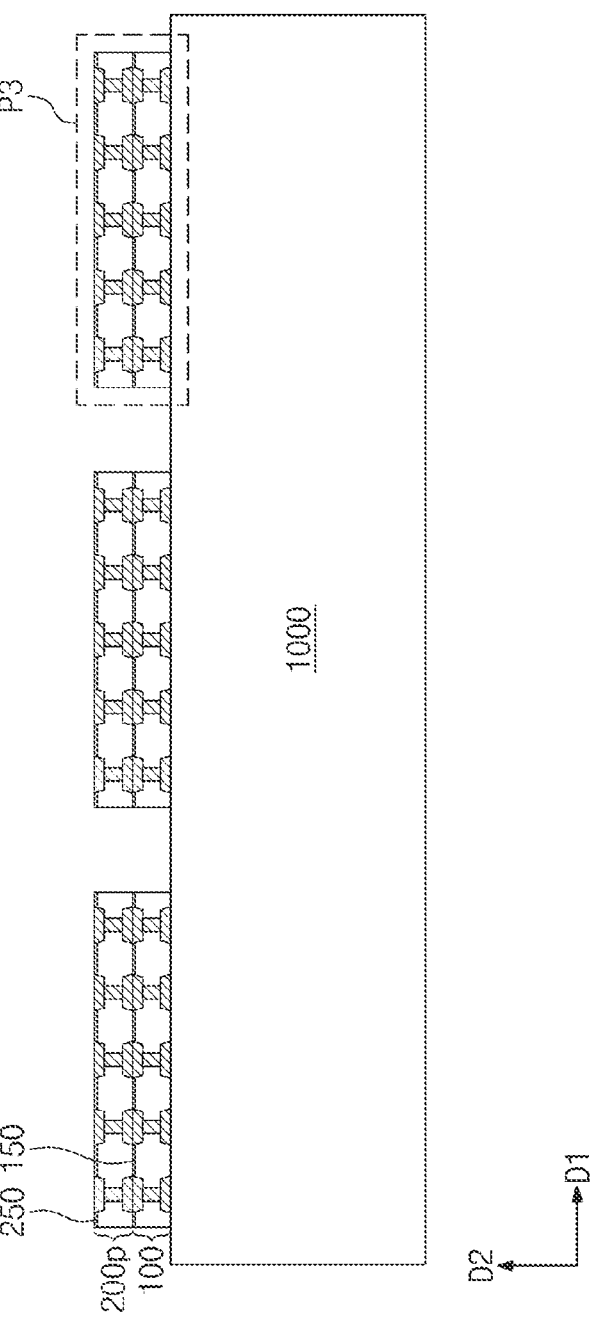
FIGS. 11, 13 and 15 are respective cross-sectional views illustrating in one example a method of manufacturing a semiconductor device according to embodiments of the inventive concept.
Figure 12:
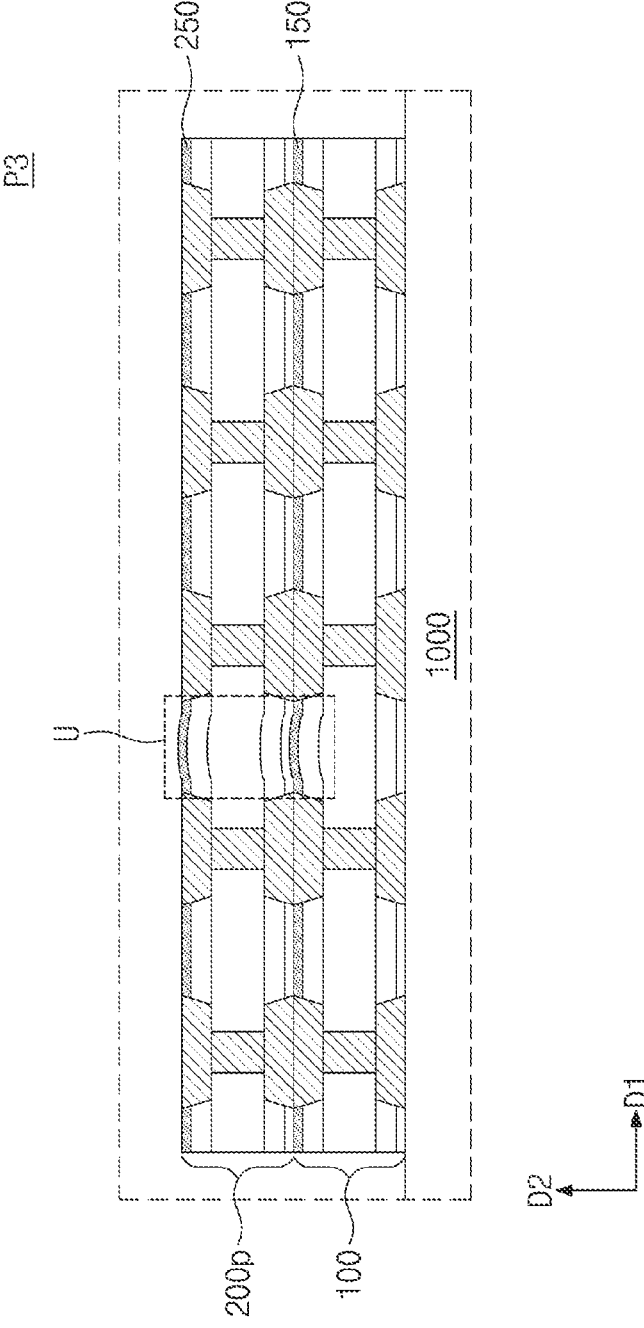
FIG. 12 is an enlarged view further illustrating a portion P3' indicated in FIG. 11, and FIGS. 14A and 14B are respective enlarged views further illustrating a portion 'P3' indicated in FIG. 13.
Figure 13:
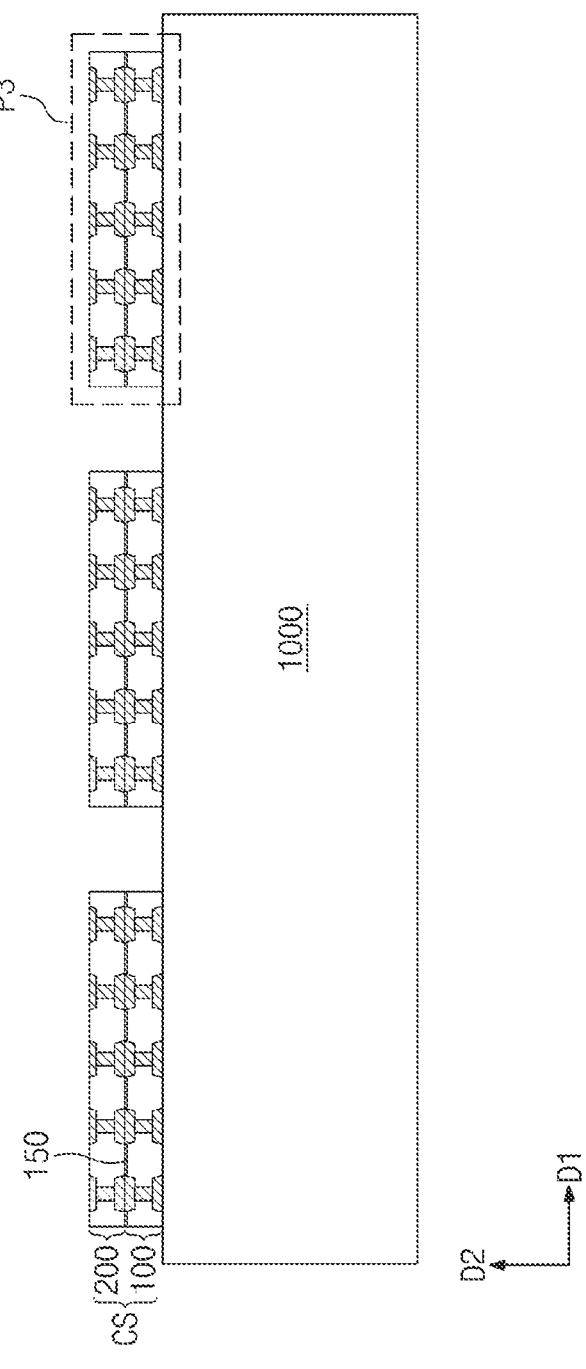
Figure 14A:
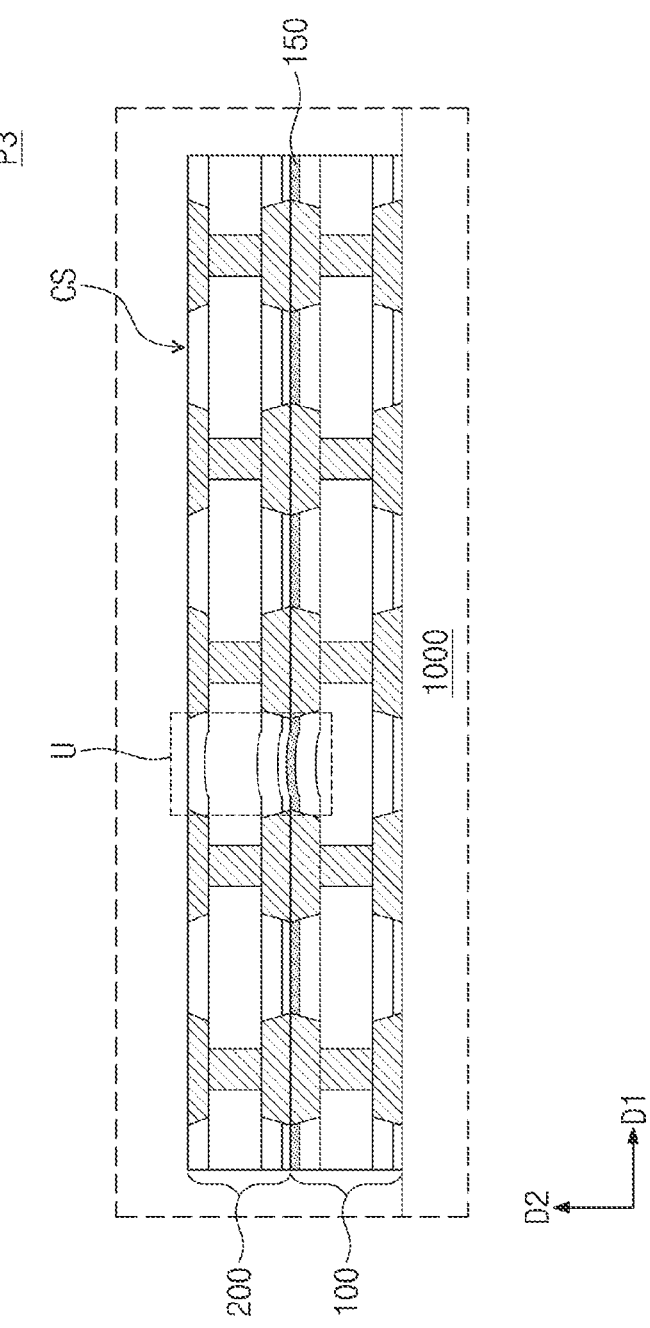
Figure 14B:
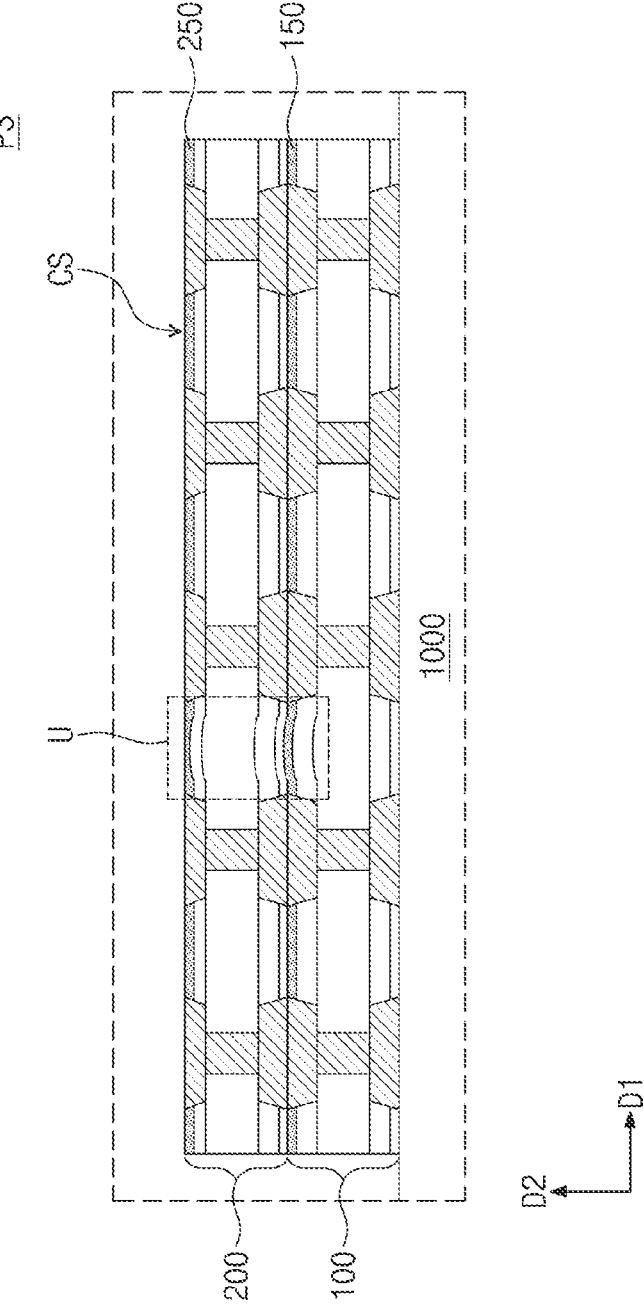
Figure 15:
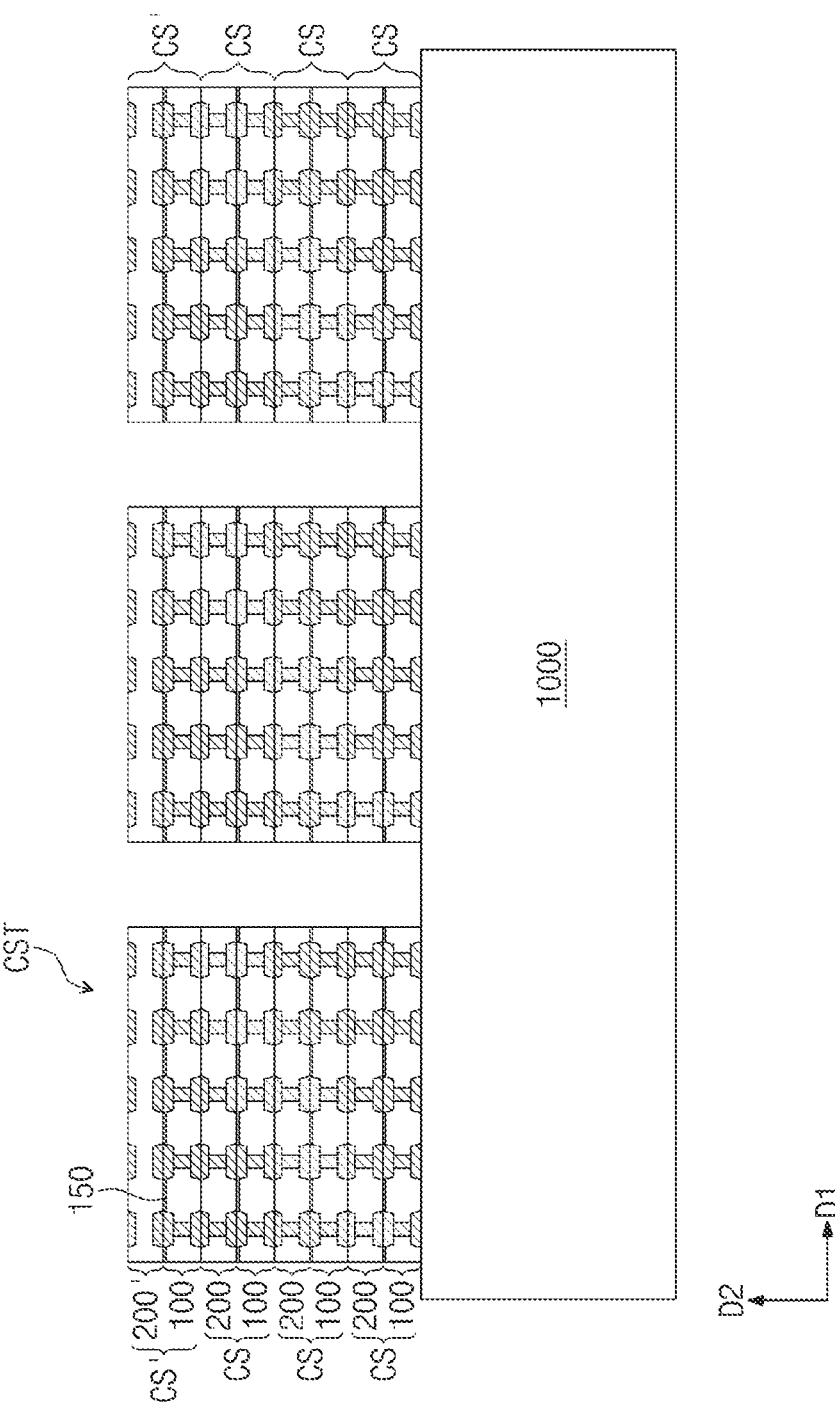

FIGS. 11, 13 and 15 are related cross-sectional views illustrating in one example a method of manufacturing a semiconductor device according to embodiments of the inventive concept; FIG. 12 is an enlarged view further illustrating a portion 'P3' indicated in FIG. 11, and FIGS. 14A and 14B are respective enlarged views further illustrating a portion 'P3' indicated in FIG. 13. Hereinafter, the method of manufacturing a semiconductor device according to embodiments of the inventive concept will be described with reference to FIGS. 11, 12, 13, 14A, 14B and 15.

Referring to FIGS. 11 and 12, one or more first chip(s) 100 may be mounted on an assembly substrate 1000. Here, multiple first chips 100 may be spaced apart in the first direction D1. The assembly substrate 1000 may be a carrier substrate for bonding chips; a package substrate (e.g., a PCB) or an interposer substrate provided in a package; or a semiconductor substrate on which semiconductor devices may be integrated. In some embodiments, the mounting of the first chip 100 may include mounting a single-layered first chip 100, but in other embodiments, the mounting of the first chip 100 may include sequentially stacking a plurality of first chips 100.

One or more preliminary second chip(s) 200p may be mounted on a corresponding first chip 100. For embodiments including a stacked plurality of first chips 100, the preliminary second chip 200p may be mounted on an uppermost first chip 100. The preliminary second chip 200p may include a second substrate 210, a second lower bonding layer 220, a second upper bonding layer 230 and a second sacrificial layer 250, and at least a portion of the second sacrificial layer 250 may be removed by a polishing process to form a second chip 200. In some embodiments, the preliminary second chip 200p may be the same chip as the first chip 100, but the scope of the inventive concept are not limited thereto.

In some embodiments, the preliminary second chips 200p may be respectively mounted on the first chips 100. That is, each of the preliminary second chips 200p may be disposed on a corresponding one of the first chips 100 and may be spaced apart from an adjacent preliminary second chip 200p in the first direction D1. The second lower bonding layer 220 of the preliminary second chip 200p may contact the first upper bonding layer 130 of the first chip 100. More particularly, one or more second lower pads 222 associated with the preliminary second chip 200p may directly contact one or more first upper pads 132 associated with the first chip 100, and the second lower protective layer 226 of the preliminary second chip 200p may directly contact the first upper insulating layer 134 of the first chip 100.

An upper surface of the first chip 100 and/or an upper surface of the preliminary second chip 200p may have an uneven profile. In some embodiments like the one shown in FIG. 12, a portion of an upper surface of the first sacrificial layer 150 of the first chip 100 may protrude upward towards the preliminary second chip 200p (See, region 15' indicated in FIG. 12). Here, a portion of an upper surface of the second sacrificial layer 250 of the preliminary second chip 200p having the same components as the first chip 100 may similarly protrude upward in a given local region. Since the protruding upper surface of the preliminary second chip 200p is located over the protruding upper surface of the first chip 100 in the region 'U', a protrusion degree of the preliminary second chip 200p may be greater than that of the first chip 100. In certain embodiments, another portion of the upper surface of the first chip 100 and another portion of the upper surface of the preliminary second chip 200p may be relatively recessed. Here, a recession degree of the preliminary second chip 200p may be greater than that of the first chip 100.

Referring to FIGS. 13, 14A and 14B, a polishing process (e.g., a chemical mechanical polishing (CMP) process) may be applied to the preliminary second chip 200p in order to complete the second chip 200.

At least a portion of the second sacrificial layer 250 and an upper portion of the second upper pad 232 in the preliminary second chip 200p may be removed by the polishing process. At this time, a portion of the second upper insulating layer 234 may be further removed. However, the second sacrificial layer 250 may include a material having a polishing selectivity with respect to the second upper insulating layer 234, and thus a removed amount of the second upper insulating layer 234 may be less than a removed amount of the second sacrificial layer 250.

The polishing process may be a wafer-level polishing process. That is, the polishing process may be performed over an entire upper surface of the assembly substrate 1000, thereby applying the polishing process simultaneously to a number of preliminary second chips 200p spaced apart from each other on the assembly substrate 1000. As a result, layer arrangements of the first and second chips 100 and 200 in chip stacks CST to be formed later may be the same as each other.

The uneven upper surface of the preliminary second chip 200p may be planarized by the polishing process, and thus an upper surface of the second chip 200 may become substantially flat. Accordingly, when another first chip 100 is stacked on the second chip 200 during a subsequent process, it is possible to prevent localized gap(s) between the chips which may occur due to uneven portion(s) of a bonding surface. As a result, stacked chips may be more readily bonded to each other, thereby improving overall electrical performance and providing better driving stability for the semiconductor device.

Before the mounting of the preliminary second chip 200p, the polishing process may not be performed on the first chip 100. That is, the polishing process may be performed on one or some of a plurality of stacked chips. Thereafter, the stacking process and the polishing process may be repeatedly performed (see, e.g., FIG. 15), and thus at least one first chip 100 may be disposed between the second chips 200 adjacent to each other in the second direction D2. For example, at least one first sacrificial layer 150 may be disposed between the adjacent second chips 200.

Since the polishing process is intermittently performed (i.e., the polishing process is performed on only the second chip 200), overall processing time may be reduced. In addition, since the polishing process is simultaneously performed on the plurality of preliminary second chips 200p spaced apart from each other, processing time may be further reduced. As a result, productivity for the semiconductor device may be improved.

In some embodiments like one shown in FIG. 14A, the second sacrificial layer 250 may be completely removed by the polishing process. Thus, an upper surface of the second upper insulating layer 234 may be exposed may be substantially coplanar with an upper surface of the second upper pad 232.

In some embodiments like the one shown in FIG. 14B, a portion of the second sacrificial layer 250 may remain on the second upper insulating layer 234 after the polishing process. Here, the fourth thickness t4 of the remaining portion of the second sacrificial layer 250 may be less than the third thickness t3 of the first sacrificial layer 150. An upper surface of the second sacrificial layer 250 may be substantially coplanar with an upper surface of the second upper pad 232. In some embodiments, the second sacrificial layer 250 may completely cover an upper surface of the second upper insulating layer 234, but in other embodiments, the second sacrificial layer 250 may expose a portion of the upper surface of the second upper insulating layer 234.

Referring to FIG. 15, stacking and polishing processes of other first and preliminary second chips 100 and 200p may be repeatedly performed a number of times on the second chip 200. Thus, a chip stack CST in which the first and second chips 100 and 200 are alternately stacked may be formed. In each of the chip stacks CST, at least one first chip 100 may be disposed between the second chips 200 adjacent to each other in the second direction D2. Layer arrangements of the first and second chips 100 and 200 in the chip stacks CST may be the same as each other.

Referring to FIG. 9, the molding layer MD covering each of the chip stacks CST may be formed. Thereafter, the chip stacks CST may singulated using, for example, a sawing process. In some embodiments, the assembly substrate 1000 may also be sawed into designated pieces, wherein each piece includes the base substrate 300 described above. In some embodiments, the chip stacks CST may be separated from the assembly substrate 1000 and then may be coupled to the base substrate(s) 300 before or after application of the sawing process.

According to embodiments of the inventive concept, it is possible to prevent a localizes gap(s) between the chips which may occur due to an uneven portion(s) at a bonding surface between the chips when the chips of the semiconductor device are stacked. This allows a stacked plurality of chips to be more readily bonded. As a result, the overall electrical performance and driving stability of the semiconductor device may be improved.

In addition, since the wafer-level polishing process may be only intermittently performed, overall processing time may be reduced. As a result, productivity of the semiconductor device may be improved.

While embodiments of the inventive concept have been particularly shown and described, those skilled in the art will understood that variations in form and detail may be made therein without departing from the scope of the inventive concept as defined by the following claims.

What is claimed is:

1. A semiconductor device comprising:
   a first chip structure and a second chip structure sequentially stacked on the first chip structure, wherein each of the first chip structure and the second chip structure includes a first chip and a second chip stacked on the first chip,
   wherein the first chip includes:
      a first substrate;
      a first upper bonding layer on an upper surface of the first substrate, wherein the first upper bonding layer includes a first upper pad and a first upper insulating layer surrounding at least a portion of the first upper pad;
      a sacrificial layer on the first upper insulating layer and surrounding at least an upper portion of the first upper pad; and
      a first lower bonding layer on a lower surface of the first substrate, wherein the first lower bonding layer includes a first lower pad and a first lower insulating layer surrounding at least a portion of the first lower pad,
   wherein the second chip includes:
      a second substrate;
      a second upper bonding layer on an upper surface of the second substrate, wherein the second upper bonding layer includes a second upper pad and a second upper insulating layer surrounding at least a portion of the second upper pad; and
      a second lower bonding layer on a lower surface of the second substrate, wherein the second lower bonding layer includes a second lower pad and a second lower insulating layer surrounding at least a portion of the second lower pad,
   wherein the sacrificial layer is disposed between the first upper insulating layer of the first chip and the second lower bonding layer of the second chip, and
   wherein the first lower bonding layer of the first chip of the second chip structure directly contacts the second upper bonding layer of the second chip of the first chip structure, and
   wherein a thickness of the second upper pad is less than a thickness of the first upper pad.

2. The semiconductor device of claim 1, wherein the first lower insulating layer of the first lower bonding layer of the first chip of the second chip structure directly contacts the second upper bonding layer of the second chip of the first chip structure.

3. The semiconductor device of claim 1, wherein a thickness of the sacrificial layer is in a range from about 1000 Å to about 2000 Å.

4. The semiconductor device of claim 1, wherein the sacrificial layer includes at least one material having a polishing selectivity with respect to the second upper insulating layer.

5. The semiconductor device of claim 1, wherein the sacrificial layer includes at least one of silicon oxide, silicon carbon oxide, or a polymer material.

6. The semiconductor device of claim 1, wherein at least one of the first chip of the first chip structure or the first chip of the second chip structure includes a stacked plurality of first chips, and
   (i) the second chip of the first chip structure is on an uppermost one of the stacked plurality of first chips of the first chip structure,
   (ii) the second chip of the second chip structure is on an uppermost one of the stacked plurality of first chips of the second chip structure, or
   (i) and (ii).

7. The semiconductor device of claim 1, wherein the first lower insulating layer of the second chip structure surrounds the portion of the first lower pad of the second chip structure,
   wherein the first chip of the second chip structure further includes a first lower protective layer surrounding another portion of the first lower pad of the second chip structure, and wherein the first lower protective layer of the first chip of the second chip structure directly contacts the second upper bonding layer of the second chip of the first chip structure.

8. The semiconductor device of claim 1, wherein the second lower insulating layer surrounds an upper portion of the second lower pad, the second chip further includes a second lower protective layer surrounding a lower portion of the second lower pad, and the sacrificial layer is between the first upper insulating layer of the first chip and the second lower protective layer of the second chip.

9. The semiconductor device of claim 1, wherein the second upper pad is electrically connected to the first upper pad, and a thickness of the second upper pad is less than a thickness of the first upper pad.

10. The semiconductor device of claim 9, wherein the thickness of the second upper pads is about 90% or more of the thickness of the first upper pad.

11. The semiconductor device of claim 1, wherein, in each of the first chip structure and the second chip structure, the second lower pad directly contacts the first upper pad, and wherein the first lower pad of the second chip structure directly contacts the second upper pad of the first chip structure.

12. The semiconductor device of claim 1, wherein the first substrate includes a first through-via electrically connecting the first upper pad and the first lower pad, and the second substrate includes a second through-via electrically connecting the second upper pad and the second lower pad.

13. A semiconductor device comprising:

a first chip and a second chip stacked on the first chip, wherein the first chip includes;

a first substrate;

a first upper pad on an upper surface of the first substrate;

a first upper insulating layer surrounding a lower portion of the first upper pad; and a first sacrificial layer surrounding an upper portion of the first upper pad, and wherein the second chip includes:

a second substrate;

a second upper pad on an upper surface of the second substrate; and a second upper insulating layer surrounding the second upper pad, and wherein a thickness of the second upper pad is less than a thickness of the first upper pad.

14. The semiconductor device of claim 13, wherein the second chip further includes a second sacrificial layer surrounding an upper portion of the second upper pad, and a thickness of the second sacrificial layer is less than a thickness of the first sacrificial layer.

15. The semiconductor device of claim 14, wherein the second sacrificial layer covers an upper surface of the second upper insulating layer.

16. The semiconductor device of claim 14, wherein the second sacrificial layer exposes a portion of an upper surface of the second upper insulating layer.

17. A semiconductor device comprising:

a first chip stack and a second chip stack spaced apart on a package substrate, wherein each of the first chip stack and the second chip stack includes at least one first chip including a first sacrificial layer on an upper surface of the at least one first chip, and a second chip stacked on the at least one first chip, wherein a first stacking arrangement order for the first chip stack is the same as a second stacking arrangement order for the second chip stack, wherein the second chip stack includes a second sacrificial layer on an upper portion of the second chip, and wherein a thickness of the second sacrificial layer is less than a thickness of the first sacrificial layer of the second chip stack.

18. The semiconductor device of claim 17, wherein a thickness of the first sacrificial layer in in a range from about 1000 Å to about 2000 Å, and the first sacrificial layer includes at least one of silicon oxide, silicon carbon oxide and a polymer material.

19. The semiconductor device of claim 17, wherein the at least one first chip includes two or more first chips, and the second chip is mounted on an uppermost one of the two or more first chips.

* * * * *